US010139458B2

(12) United States Patent
Cousins et al.

(10) Patent No.: US 10,139,458 B2
(45) Date of Patent: Nov. 27, 2018

(54) SENSOR FOR DETECTION OF MAGNETIC PARTICLES

(71) Applicant: UNIVERSITY OF SOUTH AUSTRALIA, Adelaide (AU)

(72) Inventors: Aidan Mark Francis Cousins, Adelaide (AU); Benjamin Thierry, Adelaide (AU); A. Bruce Wedding, Adelaide (AU); Daniel Forero Morales, Adelaide (AU)

(73) Assignee: UNIVERSITY OF SOUTH AUSTRALIA (AU)

(*) Notice: Subject to any disclaimer, the term of this patent is extended or adjusted under 35 U.S.C. 154(b) by 0 days.

(21) Appl. No.: 15/115,126

(22) PCT Filed: Feb. 2, 2015

(86) PCT No.: PCT/AU2015/000049
§ 371 (c)(1),
(2) Date: Jul. 28, 2016

(87) PCT Pub. No.: WO2015/113112
PCT Pub. Date: Aug. 6, 2015

(65) Prior Publication Data
US 2016/0341803 A1 Nov. 24, 2016

(30) Foreign Application Priority Data
Jan. 31, 2014 (AU) ................. 2014900294

(51) Int. Cl.
*G01R 33/09* (2006.01)
*G01R 33/12* (2006.01)

(52) U.S. Cl.
CPC ....... *G01R 33/098* (2013.01); *G01R 33/1269* (2013.01)

(58) Field of Classification Search
CPC .................. G01R 33/098; G01R 33/1269
(Continued)

(56) References Cited

U.S. PATENT DOCUMENTS

| 5,539,308 | A | * | 7/1996 | Teramae | G01P 3/481 324/173 |
|---|---|---|---|---|---|
| 6,150,809 | A | * | 11/2000 | Tiernan | G01R 33/09 324/225 |

(Continued)

FOREIGN PATENT DOCUMENTS

| CN | 1608206 A | 4/2005 |
|---|---|---|
| CN | 101120229 A | 2/2008 |

(Continued)

OTHER PUBLICATIONS

International Search Report for Application No. PCT/AU2015/000049 dated Apr. 7, 2015.
(Continued)

*Primary Examiner* — Melissa Koval
*Assistant Examiner* — Rahul Maini
(74) *Attorney, Agent, or Firm* — Tarolli, Sundheim, Covell & Tummino LLP

(57) ABSTRACT

Disclosed is a magnetic sensor for measuring flux density. The sensor comprises at least one tunnelling magnetoresistor, supporting circuitry and an output for outputting a signal from the tunnelling magnetoresistor. In another aspect, there is also provided a sensor probe comprising at least one magnetic sensor. A magnetic probe system is also described, comprising the probe sensor and processing circuitry. Methods of processing the output signal from the magnetic sensor are also described. In one application, the system and method allow for detection of tissue such as lymph nodes that have taken up small quantities of magnetic particles upon injection of a magnetic tracer containing the magnetic
(Continued)

particles into a patient, and can be used to identify such tissue that could be affected by certain forms of cancer.

32 Claims, 18 Drawing Sheets

(58) Field of Classification Search
USPC .................................................. 324/207.21
See application file for complete search history.

(56) References Cited

U.S. PATENT DOCUMENTS

| | | | | |
|---|---|---|---|---|
| 6,400,549 | B1* | 6/2002 | Davis, III | B25J 7/00 |
| | | | | 361/144 |
| 6,583,617 | B2* | 6/2003 | LeVert | G01R 33/12 |
| | | | | 324/209 |
| 7,288,933 | B2* | 10/2007 | Covington | G01D 3/08 |
| | | | | 324/207.16 |
| 8,922,205 | B2* | 12/2014 | Liu | G01R 33/098 |
| | | | | 324/207.21 |
| 9,175,942 | B2* | 11/2015 | Watanabe | G01R 33/093 |
| 2005/0087000 | A1 | 4/2005 | Coehoorn et al. | |
| 2009/0013806 | A1* | 1/2009 | Miller | F16L 55/48 |
| | | | | 73/865.8 |
| 2009/0278534 | A1 | 11/2009 | Kahlman | |
| 2010/0079908 | A1* | 4/2010 | Heidmann | G01R 33/10 |
| | | | | 360/110 |
| 2010/0090687 | A1* | 4/2010 | Wang | G01R 33/1207 |
| | | | | 324/207.13 |
| 2011/0025318 | A1 | 2/2011 | Saruki et al. | |
| 2012/0274319 | A1* | 11/2012 | Wincheski | G01R 33/12 |
| | | | | 324/239 |

FOREIGN PATENT DOCUMENTS

| | | |
|---|---|---|
| CN | 101479590 A | 7/2009 |
| CN | 101726535 A | 6/2010 |
| CN | 1019888956 A | 3/2011 |

OTHER PUBLICATIONS

Li, L. et.al.:"Detection of 10-nm Superparamagnetic Iron Oxide nanoparticles Using Exchange-Biased GMR Sensors in Wheatstone Bridge", IEEE Transactions on Magnetics, vol. 49, No. 7, Jul. 2013, p. 4056-4059. Whole document, especially abstract, section II. Experiments, Figs.1-3.

Extended European Search Report for Application No. 15743590.0 dated Aug. 7, 2017.

Chinese Office Action and Search Report corresponding to Chinese Patent Application No. 201580018089.7, dated Aug. 1, 2018.

* cited by examiner

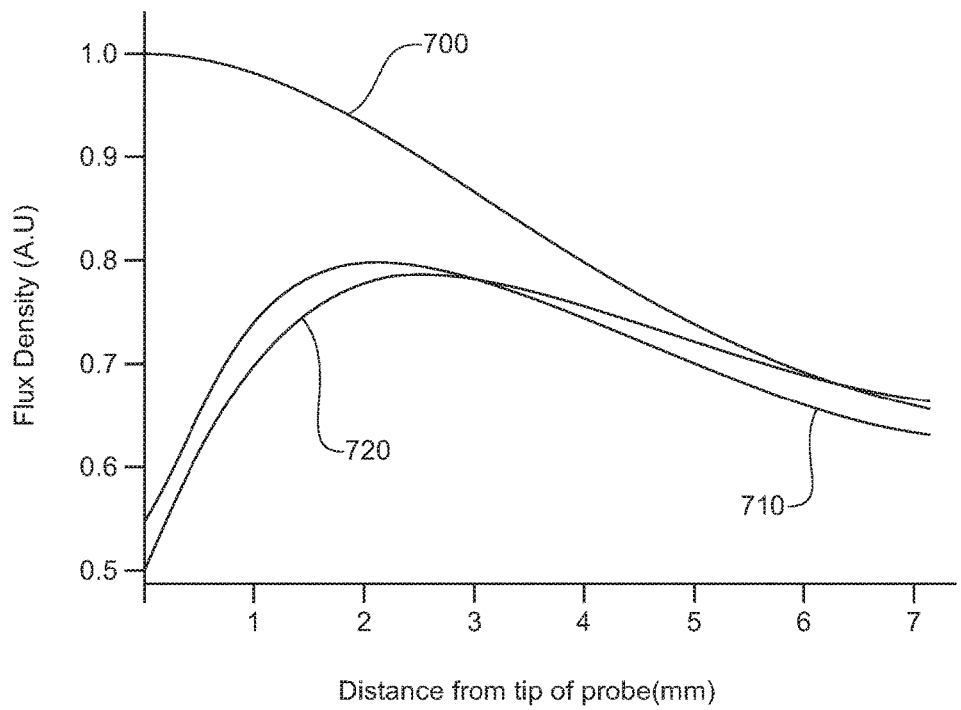
*Figure 8*
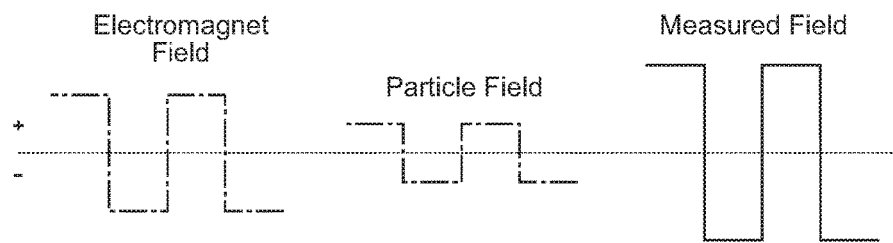
*Figure 9A*  *Figure 9B*  *Figure 9C*

SENSOR FOR DETECTION OF MAGNETIC PARTICLES

RELATED APPLICATIONS

The present invention is a U.S. National Stage under 35 USC 371 patent application, claiming priority to Serial No. PCT/AU2015/000049, filed on 2 Feb. 2015; which claims priority from AU 2014900294, filed 31 Jan. 2014, the entirety of both of which are incorporated herein by reference.

TECHNICAL FIELD

The present application relates to the detection of magnetic particles and in one particular embodiment, to the detection of magnetic particles in a body.

BACKGROUND

In many medical applications, it is useful to be able to detect or trace the location of certain components of the body, from which information relating to the state or health of a patient may be derived.

One method includes the injection into the body of a tracer element whose position is able to be detected from outside of the body. The location and movement of the tracer element provides useful information.

In some applications, the tracer is a dye that colours the tissue of interest upon interrogation from an external source.

In some other applications the tracer element is a radioactive isotope whose presence may be detected by detection of the radiation emitted by the isotope. One example of such an isotope is fluorodeoxyglucose. In use, the isotope is injected into the patient, and allowed to concentrate into the tissues of interest as will be understood by the person skilled in the art. After an allowed period of time, the location of the tracer is detected, providing information on the tissue in which the tracer is concentrated.

Disadvantages with many of the existing techniques include the use of radioactive elements and/or the need for large and costly detection equipment.

SUMMARY

According to a first aspect, there is provided a magnetic sensor for measuring flux density, comprising at least one tunnelling magnetoresistor, supporting circuitry, and at least one output for outputting an output signal proportional to the resistance of the at least one tunnelling magnetoresistor.

According to a second aspect, there is provided a sensor probe for detecting a magnetic particle, the sensor probe comprising at least one magnetic sensor according to the first aspect for sensing a fluctuation in a surrounding magnetic field; an electromagnet supporting the at least one magnetic sensor; and a signal generator input for receiving a signal from a signal generator for generating a current in the electromagnet thereby generating a sensor probe magnetic field which forms at least a part of the surrounding magnetic field.

According to a third aspect, there is provided a magnetic probe system comprising the sensor probe according to the second aspect; a signal generator for generating the signal for input to the signal generator input of the sensor probe; and a signal processor for receiving the output signal and for providing an indication of the presence of the magnetic particle.

According to a fourth aspect, there is provided a method of processing a signal received from the output of the magnetic probe system according to the third aspect, the method comprising receiving the signal from the output of the magnetic sensor; filtering out low frequency components from the signal to provide a filtered signal; offsetting the filtered signal to provide an offset signal; rectifying the offset signal to provide a rectified offset signal; and comparing the rectified offset signal to a threshold.

According to a fifth aspect, there is provided a method of detecting the presence of a magnetic particle using the magnetic probe system according to the third aspect, the method comprising: generating a signal to cause the electromagnet to induce a magnetic field; processing the output signal received from the output of the magnetic sensor; and indicating the presence of a magnetic particle if the rectified offset signal meets or exceeds the threshold.

BRIEF DESCRIPTION OF DRAWINGS

Embodiments will be described with reference to the accompanying drawings in which:

FIG. 8—shows a graph of flux density over distance for different magnetic core shapes;

FIG. 9A—shows an example waveform of the electromagnetic field generated by the electromagnet;

FIG. 9B—shows the waveform of the magnetic field generated by the magnetic particle in response to exposure to the electromagnetic field of FIG. 9A;

FIG. 9C—shows the waveform of the magnetic field measured by the magnetic sensor;

DESCRIPTION OF EMBODIMENTS

Referring now to FIG. 1, there is shown a magnetic sensor 100 according to one aspect, for measuring flux density. The magnetic sensor 100 comprises at least one magnetoresistor 10. In one embodiment, the magnetoresistor 10 is a spin tunnelling junction (STJ) device. In another embodiment, the magnetoresistor 10 is a magnetic tunnelling junction (MTJ) device. In one embodiment, the magnetoresistor 10 has a magnetoresistance of greater than 50%.

The magnetic sensor 100 also comprises a circuit 20 which provides support circuitry to the magnetoresistor 10 as will be described in more detail below. An output 30 is also provided, which outputs a signal representative of the change in properties of the magnetoresistor.

Figure 1A:
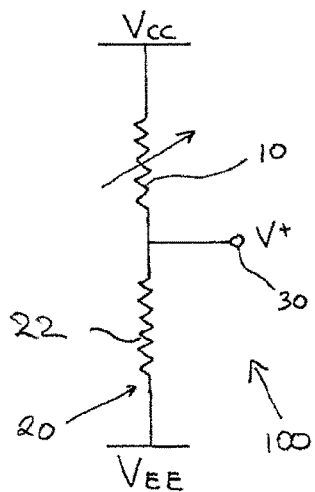
FIG. 1A—shows a magnetic sensor with one magnetoresistor according to one embodiment.

In one embodiment, as shown in FIG. 1A, magnetic sensor 100 comprises one magnetoresistor 10 with circuitry 20 comprising a single fixed resistor 22. Output 30 is provided at the junction between magnetoresistor 10 and circuit 20.

Figure 1B:
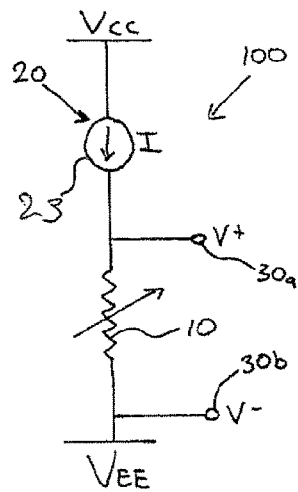
FIG. 1B—shows a magnetic sensor with one magnetoresistor according to another embodiment.

In another embodiment, magnetic sensor 100 comprises one magnetoresistor 10 with circuitry 20 comprising a current source 23 as shown in FIG. 1B. In this embodiment, output 30 is provided by the potential difference across the magnetoresistor 10 between the V+ junction 30a and the V− junction 30b.

Figure 1C:
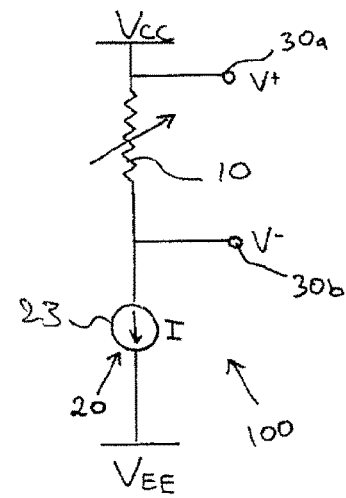
FIG. 1C—shows a magnetic sensor with one magnetoresistor according to another embodiment.

In another embodiment, magnetic sensor 100 comprises one magnetoresistor 10 with circuitry 20 comprising a current source 23 as shown in FIG. 1C. In this embodiment, output 30 is provided by the potential difference across the magnetoresistor 10 between the V+ junction 30a and the V− junction 30b.

Figure 1D:
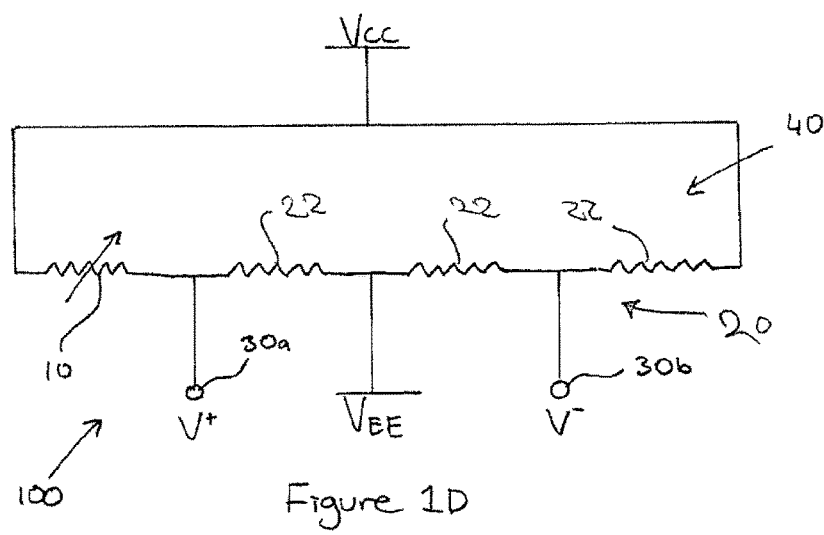
FIG. 1D—shows a magnetic sensor with one magnetoresistor according to another embodiment.

In another embodiment, magnetic sensor 100 comprises one magnetoresistor 10 with circuitry 20 comprising three fixed resistors 22 of known value. All resistors 10, 22 are arranged as a quarter active-element Wheatstone Bridge 40, as shown in FIG. 1D. In this embodiment, output 30 is provided by the V+ junction 30a and the V− junction 30b as shown.

Figure 2:
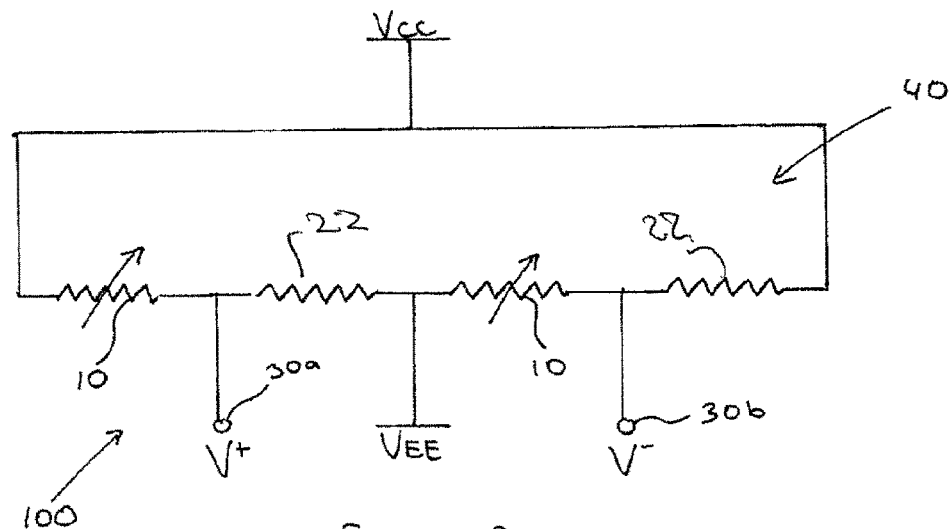
FIG. 2—shows a magnetic sensor with two magnetoresistors according to one embodiment.

In another embodiment, magnetic sensor 100 comprises two magnetoresistors 10, the circuit 20 comprising 2 fixed resistors 22 of known value, and output 30 provided by the V+ junction 30a and the V− junction 30b as shown in FIG. 2.

The magnetic sensor 100 can comprise a number of magnetoresistors, including 1, 2, 3, 4, 5, 6, 7, 8, 9, 10, 10-15 and more than 15. The magnetic sensor can be designed with the desired number of magnetoresistors depending upon the requirements of the application. For example, a magnetic sensor with a single magnetoresistor has a lower sensitivity than with multiple sensors but is the least expensive. In this arrangement, the resistance of other components of the circuit can have higher precision and higher stability. A magnetic sensor with two magnetosensors improves the signal to noise ratio and sensitivity over the single magnetoresistor device. A magnetic sensor with four magnetoresistors has a higher sensitivity, stability and signal to noise ratio, although a higher cost.

Figure 3:
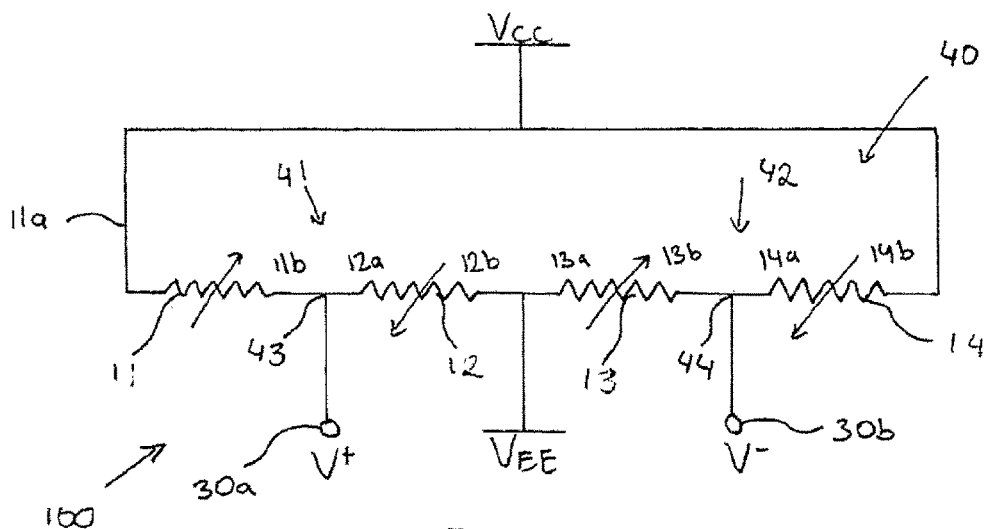
FIG. 3—shows a magnetic sensor with four magnetoresistors according to one embodiment.

In one embodiment, the magnetoresistors are arranged in a full active-element Wheatstone Bridge configuration 40 as shown in FIG. 3.

In this embodiment, the magnetoresistors 10 are provided by first magnetoresistor 11, second magnetoresistor 12, third magnetoresistor 13 and fourth magnetoresistor 14. A first end 11a of the first magnetoresistor 11 is connected to a supply voltage $V_{CC}$ and a second end 11b of the first magnetoresistor 11 is connected to a first junction point V+; a first end 12a of the second magnetoresistor 12 is connected to electrical point $V_{EE}$ with $V_{EE}$ not equal to $V_{CC}$ such that an electric potential exists between them; the first and second magnetoresistors 11, 12 forming a first leg 41. A first end 13a of the third magnetoresistor 13 is connected to $V_{EE}$ and a second end 13b of the third magnetoresistor 13 is connected to a second junction point 44, and a first end 14a of the fourth magnetoresistor 14 is connected to the second junction point 44 and the second end 14b of the fourth magnetoresistor 14 is connected to $V_{CC}$, the third and fourth magnetoresistors forming a second leg 42.

In this embodiment, the output 30 is provided by the potential difference between the first junction point 43 and the second junction point 44 at points V+ (30a) and V− (30b). This provides a measure that is proportional to the flux density measured by the magnetoresistors.

Figure 4A:
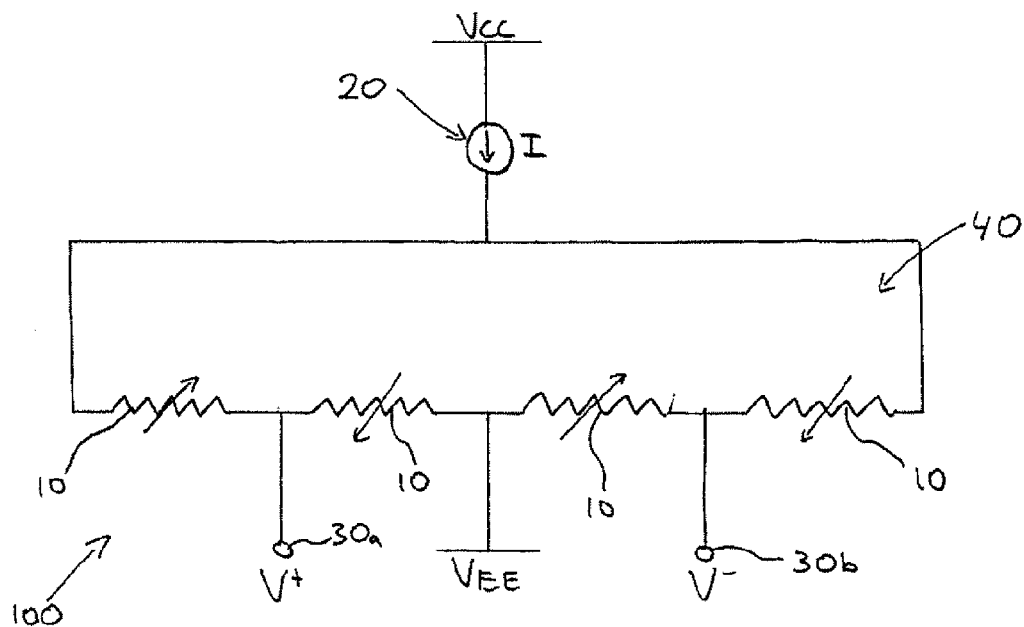
FIG. 4A—shows one embodiment of a magnetic sensor with four magnetoresistors with supporting circuitry.

Magnetoresistors can be damaged by exposure to high magnetic flux. Magnetoresistors used in this application typically have a threshold of about 12V, after which they can be damaged. In another embodiment, as shown in FIG. 4A, a constant current source can be utilised such that the voltage drop across each of the magnetoresistors is limited to less than 12V while still allowed to vary in accordance with the magnetic field. This can be measured as a change in the voltage drop across the Wheatstone Bridge 40 at V+ and V− as shown in FIG. 4A, providing the output 30.

Figure 4B:
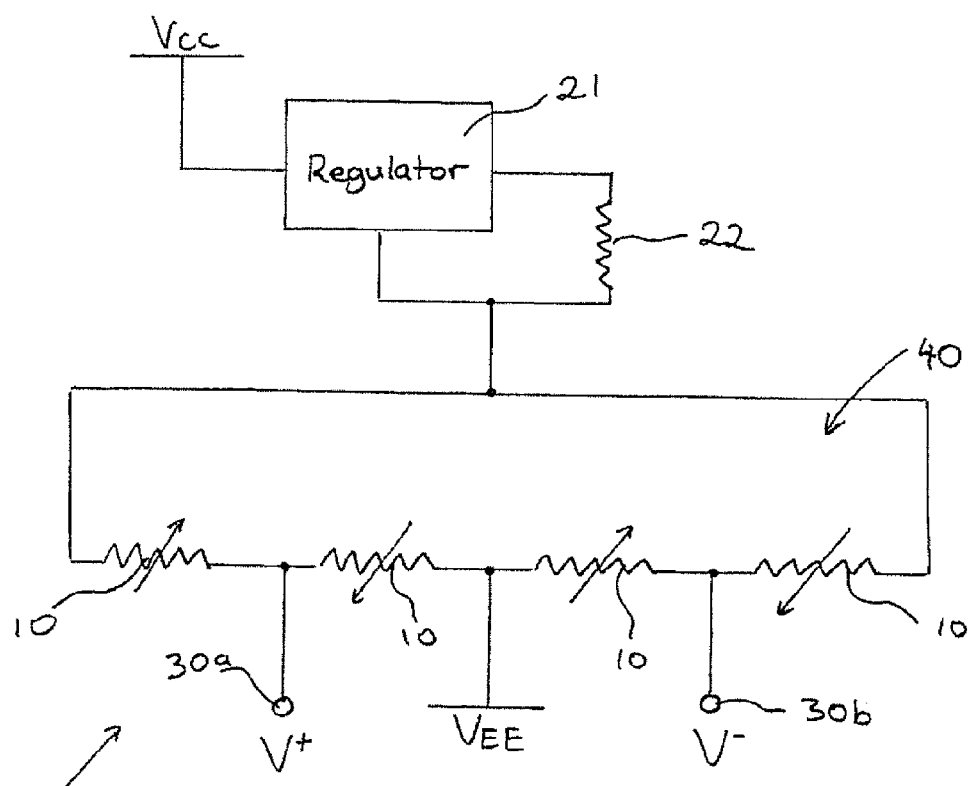
FIG. 4B—shows another embodiment of a magnetic sensor with four magnetoresistors and supporting circuitry.

Another embodiment of the arrangement of FIG. 4A is shown in FIG. 4B. In this embodiment, the Wheatstone bridge 40 is the same as in FIG. 4A, but with the circuit 20 comprising voltage regulator 21 and fixed resistor 22 of known value. In this embodiment, the circuit is supplied by positive and negative rails $V_{CC}$ and $V_{EE}$. In this particular embodiment, the current supplied to the Wheatstone bridge 40 is controlled via voltage regulator 21 and fixed resistor or resistor network 22. The voltage drop across the magnetoresistors 10 varies with variations in the magnetic flux, and control of the current ensures that the maximum voltage drop across any magnetoresistor 10 during normal operation is limited to less than 12V. The output of the magnetic sensor 100 is then taken as the potential difference between the junction point V+ and the junction point V−.

According to another aspect, there is provided a sensor probe 200 for use with the magnetic sensor 100 described with reference to FIGS. 1 to 4B. In one embodiment, the sensor probe 200 comprises an electromagnet supporting one of the magnetic sensors described above, and a signal generator input for receiving a signal from a signal generator for generating a current in the electromagnet, thereby generating the magnetic field.

Figure 5:
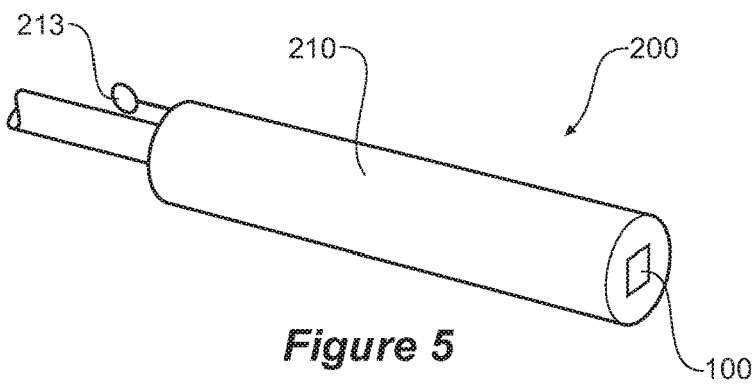
FIG. 5—shows one embodiment of a sensor probe.

FIG. 5 shows a schematic of an embodiment of sensor probe 200, comprising the electromagnet 210 with magnetic sensor 100 at a tip of the electromagnet 210, and the signal generator input 213.

Figure 6:
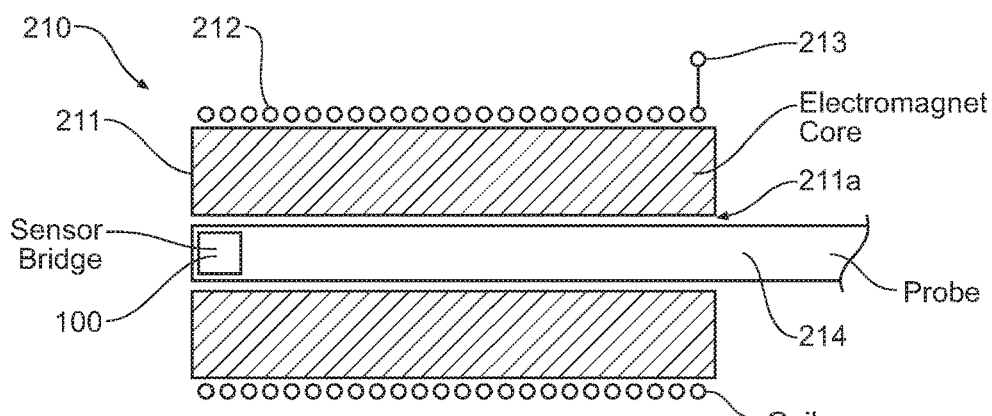
FIG. 6—shows another embodiment of the sensor probe.

FIG. 6 shows another embodiment of the sensor probe 200. In this embodiment, electromagnet 210 is provided by an electrically conductive coil 212 surrounding a core 211. Core 211 has a core aperture 211a which receives a shaft 214 which in one embodiment is a printed circuit board containing components used in the signal analysis and in another embodiment is a printed circuit board containing only the circuit used for magnetic sensor 100.

In this embodiment, the shaft 214 has connected to its tip, the magnetic sensor 100, with the electromagnet 210 located at the tip and surrounding the magnetic sensor. The signal generator input 213 is provided by a connection to the coil 212, to receive a signal generated by a signal generator (not shown in this view) as will be described in more detail below.

In one embodiment, the magnetic sensor 100 is bare die mounted in either a small outline integrated circuit package or on a printed circuit board, forming the tip of the sensor probe 200. In one embodiment, the tip of the sensor probe has a diameter less than or equal to about 10 mm.

Figure 7A:
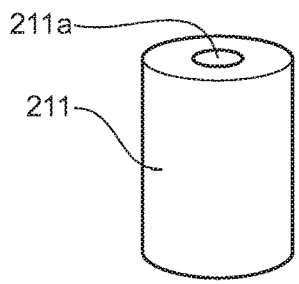
FIG. 7A—shows one embodiment of a magnetic core.
Figure 7B:
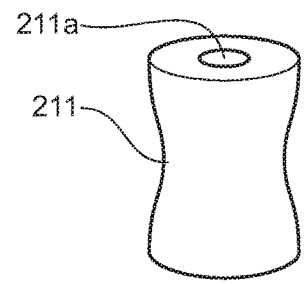
FIG. 7B—shows another embodiment of a magnetic core.
Figure 7C:
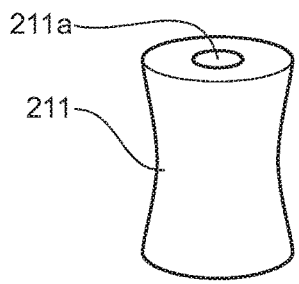
FIG. 7C—shows another embodiment of a magnetic core.
Figure 7D:
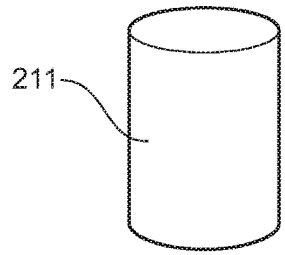
FIG. 7D—shows another embodiment of a magnetic core.

Core 211 can be of any suitable magnetic material. In one embodiment, the core 211 is iron, having a high relative permeability. In one embodiment, the relative permeability $m_r$ is greater than 100. In some embodiments, the core 211 is a cylinder. In other embodiments, the core 211 is a bobbin-shape. FIGS. 7A to 7D show core configurations according to different embodiments. In one embodiment as shown in FIG. 7A, the core 211 is substantially cylindrical. In another embodiment as shown in FIG. 7B, the core 211 is bobbin-shaped. In another embodiment as shown in FIG. 7C, core 211 is also bobbin-shaped. In another embodiment as shown in FIG. 7D, core 211 is a solid core with no aperture.

The shape and configuration of the core affects the field pattern as will be understood by the person skilled in the art. For example, the flux at the edges of a solid core is greater than that of the flux at the edges of a hollowed core, however, the flux can be greater at further distances away from the core for hollowed cores. By adjusting the shape of the core 211, the flux pattern can be adjusted as desired. For example, for a bobbin-shaped core, the flux density can be further probing than that of a cylindrical core.

FIG. 8 shows a graph comparing flux density (A.U.) versus the distance (mm) of the magnetic particles from the tip of the probe for varying core shapes. As can be seen, the flux density for a solid core 700 is higher than the flux density of both a cylinder core 710 and bobbin core 720 at the tip of the probe. Whilst the solid core 700 has a decreasing flux density as distance from the tip of the probe increases, both cylinder 710 and bobbin 720 shapes have an initial increase in flux density with distance up to a maximum value (3.25 mm for a cylinder or bobbin of 9 mm diameter and 4 mm aperture), thus ensuring the sensor 100 is in a region of lower flux density than the sample if the sample is placed within this region.

The magnetic field generated by the electromagnet 210 is controlled by the signal input to the electromagnet via the signal generator input 213. This signal is generated by a signal generator to produce a time-varying magnetic field of desired characteristics. In one embodiment, the magnetic field is unidirectional (either parallel or antiparallel to the sensing axis of the sensor probe). In another embodiment, the magnetic field is bidirectional (fluctuating between parallel and antiparallel to the sensing axis of the sensor probe). In one embodiment, the magnetic field generated has a 50:50 duty cycle with sufficient flux density to cause the alignment of an ensemble of magnetic particles within a 1-second timeframe.

The type of magnetic field desired to be generated is dependent on factors such as the quality of the magnetic particles to be detected, and the type of medium in which the particles are to be inserted and located. The 'quality' of the particles refers to the ability of an ensemble of particles to be magnetised by an externally-applied field and to relax to an overall unmagnetised state once the externally-applied field has been removed (so called 'superparamagnetism'). In the present application, particles are considered to have a high quality if they have short magnetising and relaxation times (for example less than 1 ms). These properties are generally achieved with particles of less than 20 nm diameter.

Particles have two methods of relaxing—Néel or Brownian. Decay time is observed as a combination of both Néel and Brownian components; however, the shortest time is often the most dominant. High quality particles will decay quickly in either colloidal or immobilised (e.g. dried or frozen) form as the Néel relaxation times for immobilised particles is very short, but low quality particles (>20 nm) will decay via much longer Néel relaxation times when immobilised, and hence behave as superparamagnetic in a colloid, but ferrimagnetic when immobilised.

If the particles used are of high quality, then either a uni- or bidirectional field can be used, but if the particles are of low quality, unidirectional fields can only be used in environments where the particles remain mobilised (and therefore decay via the faster Brownian mechanisms). If low quality particles are used and the particles are immobilised during their application, then a bidirectional field is used, otherwise the signal from the particles will be filtered out during signal management. The resultant signal of the sensor probe when particles are present will be a superposition of the electromagnet field generated by the electromagnet, and the particle response field.

Table 1 below shows the types of field desired for given particle relaxation times and types of media.

TABLE 1

| | Particle diameter | | | |
|---|---|---|---|---|
| Medium Type | <20 nm | 20 nm | 25 nm | >25 nm |
| Tissue | Bidirectional Field Unidirectional Field | Bidirectional Field Unidirectional Field1 | Bidirectional Field | Bidirectional Field |
| Air | Bidirectional Field Unidirectional Field | Bidirectional Field Unidirectional Field1 | Bidirectional Field | Bidirectional Field |
| Water | Bidirectional Field Unidirectional Field | Bidirectional Field Unidirectional Field | Bidirectional Field Unidirectional Field | Bidirectional Field Unidirectional Field |

Note that threshold size for low quality particles depends on the particle composition (e.g. magnetic susceptibility, coercivity and hysteresis). Data used are for uncoated magnetic nanoparticles.

FIG. 9A shows a representation of one form of the electromagnetic field generated by the electromagnet 210, showing in this example, a bidirectional or binary state field of a substantially square wave shape. FIG. 9B shows the magnetic field generated by the particles in response to exposure to the magnetic field of FIG. 9A. The resulting magnetic field is shown in FIG. 9C. This signal is provided from the output 30 of the magnetic sensor 100 as previously described, where the output in one embodiment is a voltage signal that varies according to variations in the magnetic flux detected by the one or more magnetoresistors 10. This detected magnetic field is a superposition of the magnetic field generated by the electromagnet 210 as shown in FIG. 9A, and the magnetic field (FIG. 9B) generated by the particles in response to this magnetic field.

To determine whether the particles have been detected within the region of the sensor probe's influence, the output signal as shown in FIG. 9C provided at the output 30 is processed to isolate the signal associated with the magnetic field attributed to the nanoparticles/magnetic particles from the background noise. In this application, background noise includes signals associated with the Earth's magnetic field and the magnetic field generated by the electromagnet. Any imbalances in the magnetic sensor such as a mismatch in zero-field sensor resistances or due to thermal gradients at the tip of the sensor probe may affect magnetoresistor resistance.

In other embodiments of the sensor probe 200, the magnetic sensor 100 is located inside the electromagnet core 211, in aperture 211a, rather than at the tip. In some applications, in high magnetic fields, the magnetoresistors 10 can become saturated. It has been found that the space within the electromagnet core aperture 211a can provide some shielding from the external magnetic field generated by the electromagnet 210. The further inside the electromagnet core aperture 211a the magnetic sensor 100 is located, the more the magnetoresistors 10 in the magnetic sensor 100 are shielded, and the higher the external magnetic field can be made without saturating the magnetoresistors 10. Thus in some embodiments, the magnetic sensor 100 is able to be located at varying distances from the tip inside the electromagnet core aperture 211a. In this way, the location of the magnetic sensor 100 can be optimised for a given set-up. On some embodiments, the sensor probe 200 is provided with a single magnetic sensor 100 at a set location, and the user can select the sensor probe accordingly, for the required application. In other embodiments, the magnetic sensor 100 is able to be moved up and down within the electromagnet core aperture 211a by any suitable means. In other embodiments still, sensor probe 200 is provided with a plurality of magnetic sensors 100 located at different distances from the tip within the magnetic core aperture 211a, with each magnetic sensor 100 being able to be selectively switched in and out of circuit to thereby allow selection of a magnetic sensor at the required location to optimise the sensor probe 200 for a particular application.

It will be appreciated that in these embodiments, all of the magnetoresistors 10 are exposed to the same external magnetic field.

In another embodiment, an optimum coil current is determined and used to ensure that the signal received from the magnetosensor is not diluted or otherwise interfered with by the surrounding electromagnetic field. A specific example of this is described in more detail below in the description of an example experimental setup.

Figure 10:
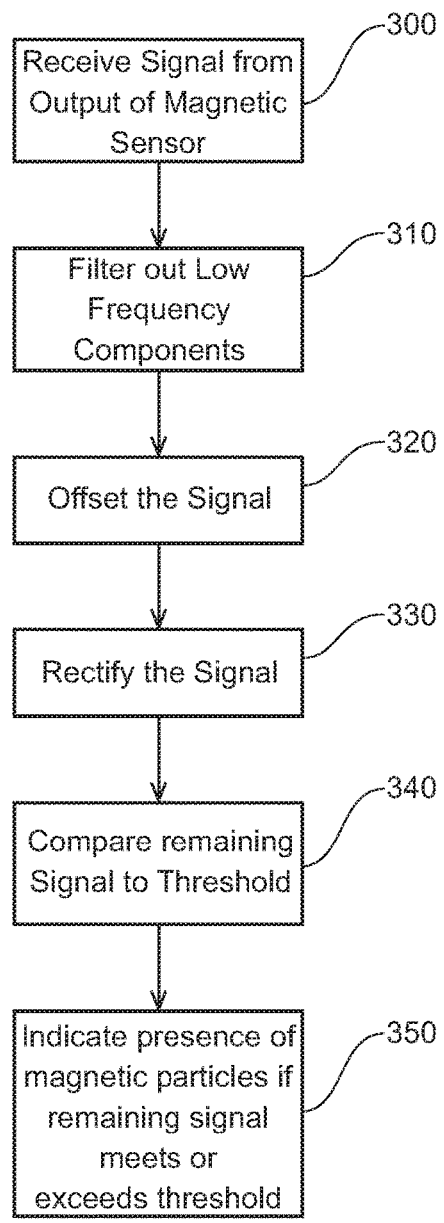
FIG. 10—shows a flowchart of one embodiment of a method of processing the signal measured by the magnetic sensor.

In one embodiment, as shown in FIG. 10, the signal from the output 30 of the magnetic sensor 100 is received at step 300. In a first filtering step 310, unwanted frequency components are filtered out using a low pass, high pass or combination band pass filter. This removes the signal generated by moving the sensor probe with respect to the flux vectors of the Earth's magnetic field, as well as high frequency noise. In one embodiment, at step 320 the signal is offset to remove any internal or introduced bridge bias as described above to produce an offset signal, and in step 330, the resulting filtered AC signal is rectified. This produces a rectified offset signal, being in one embodiment, a DC signal proportional to the positive amplitude of the signal detected by the sensor probe 200 or more specifically, the magnetic sensor 100 after removal of background noise.

This amplitude is then compared to a detection threshold in step 340 and if the amplitude meets or exceeds the threshold, then an indication of the presence of the particles is given at step 350. This indication can take any means including a reading from a voltmeter displaying changing voltage proportional to the quantity of particles detected, or as an audio signal, with a pitch and amplitude proportional to the signal and hence particle quantity detected. In other embodiments, a non-varying indication is given, such as a single beep, or a light turning on, representing the detection of a threshold quantity of particles. In another embodiment, the detection signal is provided as a vibration of the sensor probe detectable by the user. This vibration may be a set vibration, or may increase with increasing quantities of detected particles.

In some embodiments, the signal output from the sensor probe 200/magnetic sensor 100 is processed using only analogue components. In other embodiments, the signal is processed using analogue pre-conditioning, followed by digital processing using microprocessors for example.

In the case of purely analogue processing, in one embodiment, the background component is separated from the rest of the signal using a fast-response low pass filter, such as a Sallen-Key low pass filter. This component is then subtracted from the original signal to leave only the signal from the particles and/or the electromagnet 210. This (now correctly offset) time-varying signal is then rectified and filtered to produce a DC signal equal to the positive amplitude of the pre-rectified signal. This DC signal is then offset via manual control and the small signal is then analysed or processed using either data acquisition software, or direct feedback to the user as previously described.

Figure 11A:
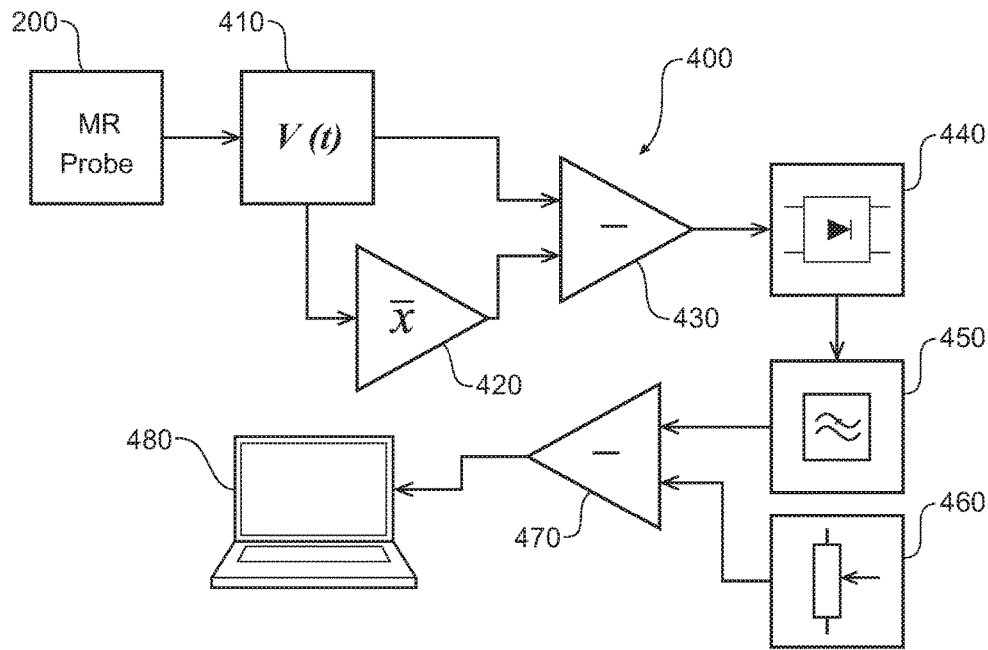
FIG. 11A—shows a schematic diagram of an arrangement for processing the signal measured by the magnetic sensor according to one embodiment.

FIG. 11A is a schematic diagram of the main components of a signal processor 400 to carry out the processing method described above. In this embodiment, the output signal from the sensor probe 200 is received by a processor input 410. The signal is then split and one part filtered using a low pass filter 420 such as a fast-response low pass filter such as a Sallen-Key low pass filter and then subtracted from the original signal at subtracter 430 to leave only any signal generated by the particles and/or the electromagnet 210.

This signal is then rectified by rectifier 440 and then filtered by second low pass filter 450 to produce a DC signal equal to the positive amplitude of the pre-rectified signal. This DC signal is then offset via manual control 460 (e.g. potentiometer) and the resultant signal output from second subtracter 470 is then analysed by a processor 480 (for example in a Personal Computer device) or analogue device such as a potentiometer (not shown) to indicate the presence or non-presence of the magnetic particles.

In the other method of processing the signal using analogue preconditioning followed by digital processing, the signal from the sensor probe 200 is filtered using a band pass filter with $f_0$ set to the driving frequency of the electromagnet 210, and offset to remove any DC level background. The signal is then passed through a lock-in amplifier that is referenced to the frequency of the electromagnet 210. The output of the lock-in amplifier will be proportional to the amplitude of the signal at the input, and hence represents an offset and rectified version of the signal from the sensor probe 200. In this processing embodiment, the output signal has a large signal to noise ratio. This signal is then processed by a processor such as a microcontroller, through which the user can set the desired threshold level of detection.

Figure 11B:
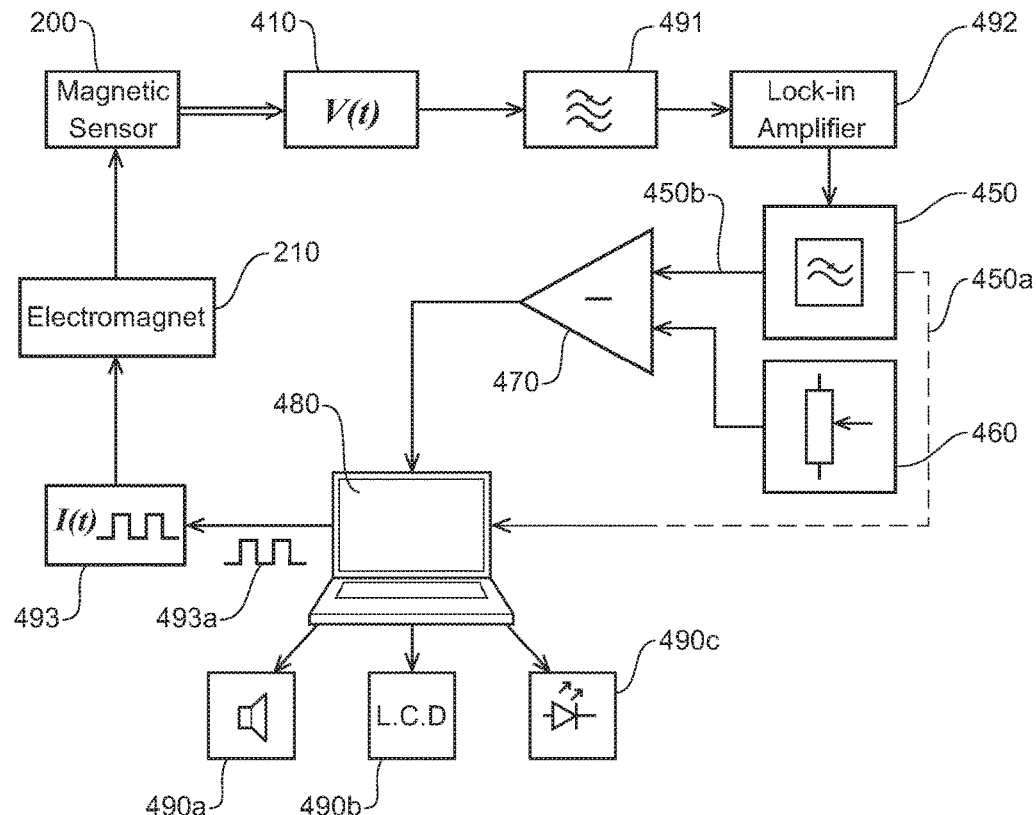
FIG. 11B—shows a schematic diagram of an arrangement for processing the signal measured by the magnetic sensor according to another embodiment.

FIG. 11B is a schematic diagram of the main components of a signal processor 400 to carry out the processing method described above. In this embodiment, the output signal from the sensor probe 200 is received by a processor input 410. The signal is then passed through a bandpass filter 491 before being processed by the lock-in amplifier 492. The output from 492 is then filtered by a fast-response low pass filter such as a Sallen-Key low pass filter 450 to produce a stable DC signal.

This DC signal 450b is then offset via manual control 460 (e.g. potentiometer) and the resultant signal output from second subtracter 470 is then analysed by a processor 480 or analogue device such as a potentiometer (not shown) to indicate the presence or non-presence of the magnetic particles. In another embodiment, the output 450a of low pass filter 450 is analysed directly by the processor 480 and the offset performed by digital processing.

An indication of the result can be provided to the user by various means including indications on a screen 490b, actuation of a lighting element 490c or by emitting an audio indication 490a or any combination of the above.

Output 493a is an example of an alternating signal produced by the processor PC (480), and contains information such as the waveform (square or sinusoidal, for example), and the frequency (for example, 180 Hz square wave). Block 493 provides current amplification and adjustment to the polarity (e.g. to get a bidirectional alternating current) of the output signal 493a. This amplified signal is then applied to the electromagnet 210. Block 493 can be any suitable circuit including a current amplifier, or a current driver such as an h-bridge.

Figure 12A:
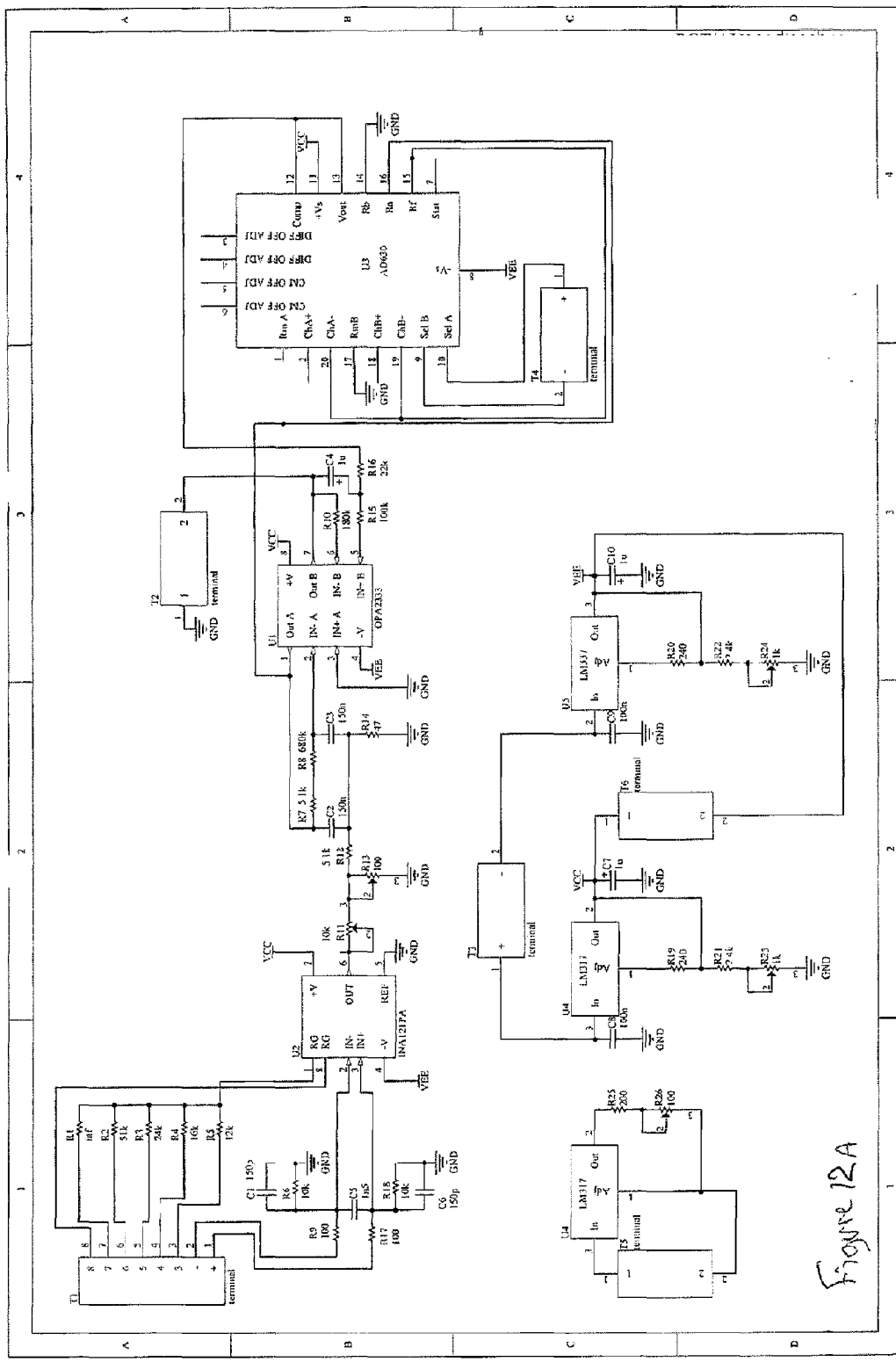
FIG. 12A—shows a circuit schematic of one embodiment of a signal processor.

FIG. 12A shows an example of a circuit schematic of one embodiment of the signal processor 400 described above.

Figure 12B:
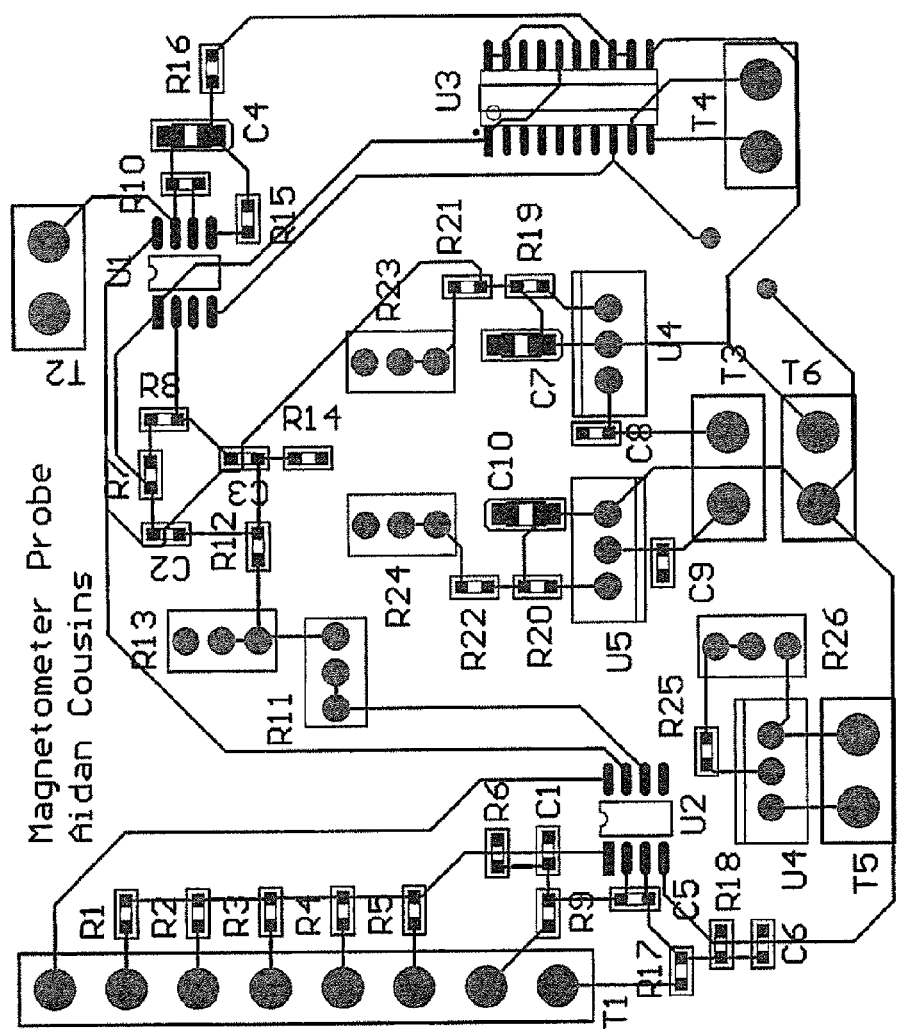
FIG. 12B—shows a PCB layout of the circuit of FIG. 12A.

FIG. 12B shows an example of a printed circuit board (PCB) layout of the signal processor circuit of FIG. 12A.

Figure 13:
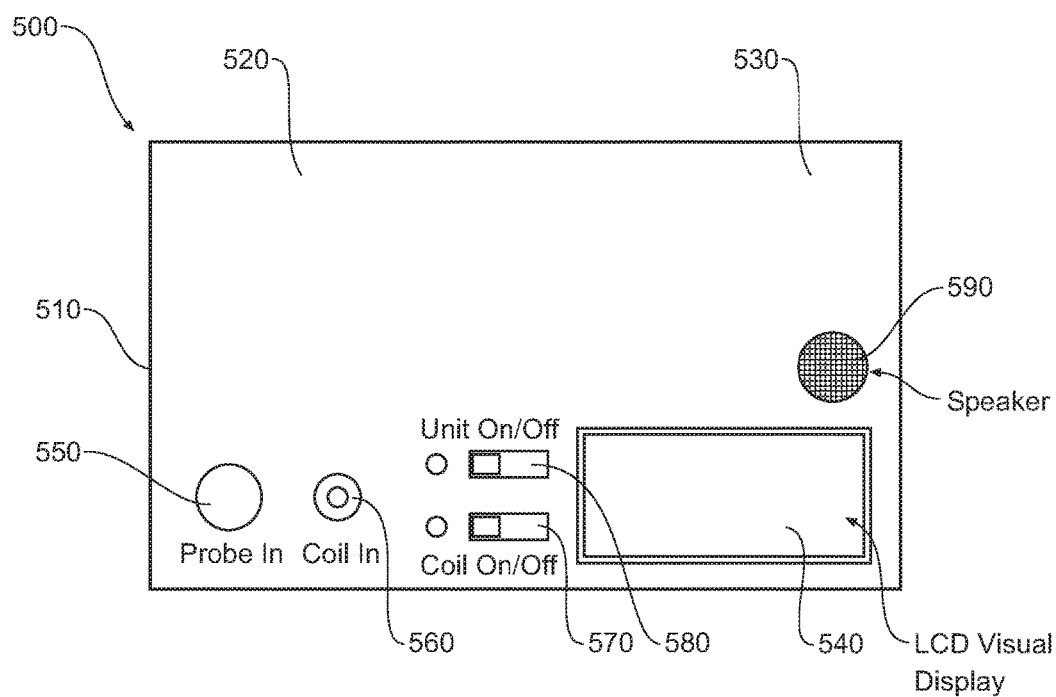
FIG. 13—shows a main unit for connection to the sensor probe.

FIG. 13 shows one embodiment of a main unit 500 comprising casing 510, containing the various systems and components described above. In this embodiment, a dedicated power supply such as batteries stored in battery compartment 520 to allow the main unit to be portable and operated away from other power supplies. In other embodiments, the main unit is able to be plugged into an external power source such as mains or supply power, and in other embodiments, both forms of power are provided as options. The circuitry required to generate the signal to be provided to the electromagnet and the circuitry and components required for the signal processor 400 are housed in circuit compartment 530. The main unit output 560 of the main unit 500 that provides the signal to the sensor probe 200 to energise the electromagnet is provided to receive a connector from the sensor probe 200. The signal from the output of the sensor probe 200 (specifically, the output 30 of magnetic sensor 100) is applied to main unit input 550 via a suitable connector. This signal is applied to the input of the signal processor 400 as previously described.

The casing 510 is in one embodiment, made from an electrically conductive material such as steel or aluminium, to shield the electronic components from outside noise. In one embodiment, ventilation holes are provided to remove heat generated from the operation of the batteries. In one embodiment, a cooling fan can also be provided.

In some embodiments, different types of feedback can be provided on the main unit 500 such as a visual display 540 and/or an audio speaker 590. Coil control switch 570 and main unit on/off switch 580 are also provided.

Figure 14A:
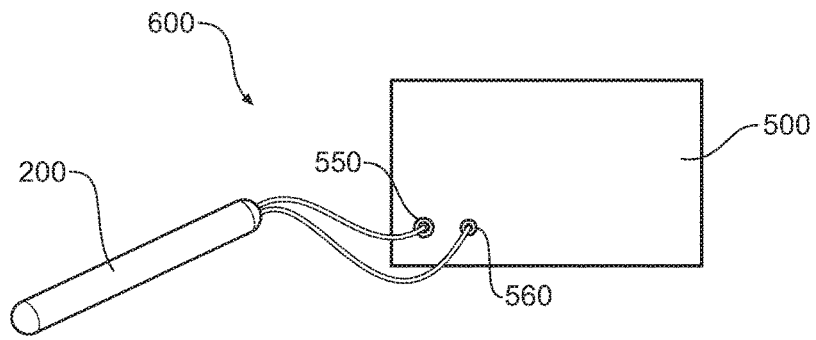
FIG. 14A—shows one embodiment of a magnetic probe system comprising the sensor probe and the main unit.

FIG. 14A shows an embodiment of a magnetic probe system 600 comprising the main until 500 and the sensor probe 200. In this arrangement, sensor probe 200 is connected to main unit 500 via respective connectors to main unit input 550 (probe in) and main unit output 560 (coil in) as previously described.

Figure 14B:
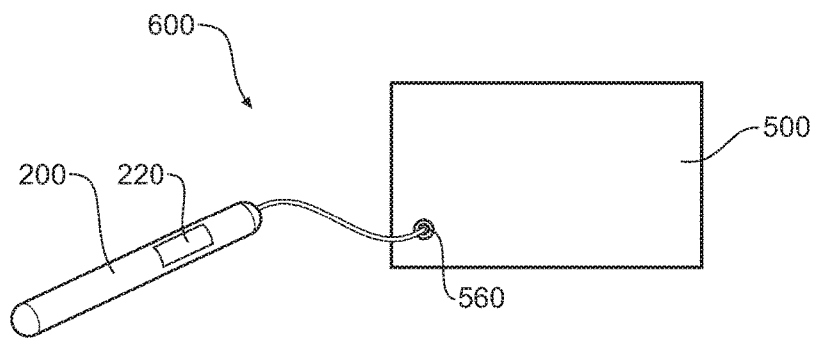
FIG. 14B—shows another embodiment of a magnetic probe system comprising the sensor probe containing the signal processor and the main unit containing the signal generator.

In another embodiment as shown in FIG. 14B, sensor probe 200 itself contains the signal processor 400 for processing the signal measured by magnetic sensor 100. In this embodiment, sensor probe 200 is connected to main unit 500 which in this embodiment contains only the signal generator circuitry for generating the signal to excite the electromagnet 210 in the sensor probe 200. In this embodiment, sensor probe 200 also includes a sensor probe indicator 220 to indicate the presence of the magnetic particles. In one embodiment, the sensor probe indicator 220 is a visual display. In another embodiment, the sensor probe indicator 220 is an audio generator and in another embodiment, the sensor probe indicator 220 is a vibrator to cause the sensor probe to vibrate upon detection of the magnetic particles to provide tactile feedback to the user. Thus in this embodiment, magnetic probe system 600 is provided by main unit 500 acting as a signal generator only and sensor probe 200 incorporating the signal processor 400.

Figure 14C:
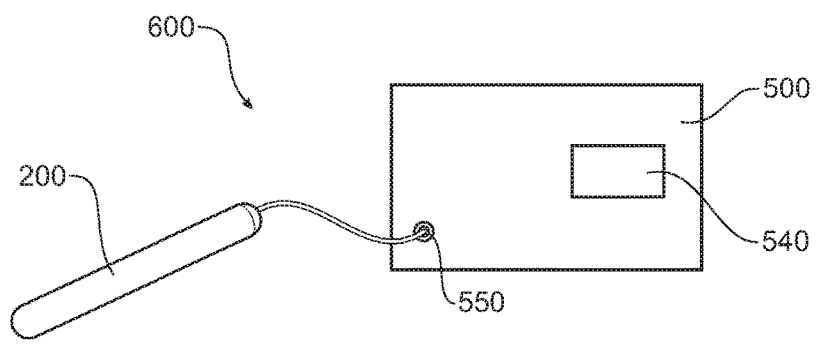
FIG. 14C—shows another embodiment of a magnetic probe system comprising the sensor probe containing the signal generator and the main unit containing the signal processor.

In another embodiment as shown in FIG. 14C, the magnetic probe system 600 also comprises the sensor probe 200 and main unit 500, but in this embodiment, sensor probe 200 contains the signal generator to generate the signal to excite the electromagnet 210 to generate the magnetic field. The main unit 500 contains only the signal processor 400 for receiving and processing the measured signal from sensor probe 200. In this embodiment, sensor probe 200 is connected to main unit 500 via main unit input 550. In this embodiment, main unit 500 also has display 540 for indicating to the user the presence of the magnetic particles.

Figure 14D:
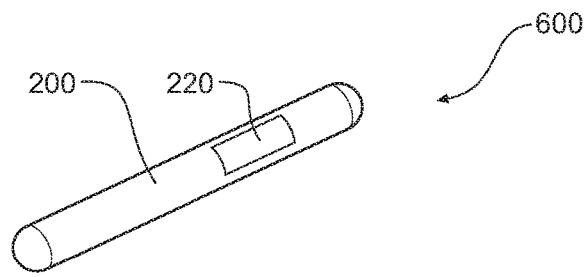
FIG. 14D—shows another embodiment of a magnetic probe system comprising only the sensor probe which contains the signal generator and the signal processor.

In yet another embodiment as shown in FIG. 14D, magnetic probe system 600 is provided by sensor probe 200 only, which has integrated within it, the signal generator and the signal processor 400. In this embodiment, there is thus no need for an external main untiil 500.

The following describes a particular implementation of the various aspects described herein, including its application to an experimental subject.

Following is a description of an example experimental set up and procedure using an embodiment of the sensor probe 200 with lymph nodes removed from a swine model.

Probe set-up: Four STJ-201 magnetoresistors 10 in a Wheatstone bridge configuration attached to a simple printed circuit board formed the tip of the magnetic sensor 100. The magnetic sensor 100 was placed inside the electromagnet core 211 bobbin via a central aperture as described further below. The position of the sensor tip was flush with the aperture opening 211a, yet the sensor was not saturated due to the relatively low flux created by the 90-turn electromagnet coil. In other example experiments, a 480-turn coil was used, with the sensor tip located further inside the bobbin to prevent saturation of the sensor). The electromagnet 210 and sensor tip form the tip of the probe 200.

The Wheatstone bridge of the sensor tip was powered by a constant current supply of 6.25 mA, (supplied by an LM317 adjustable regulator) to prevent damaging voltage drops of 12V or more across the magnetoresistors 100 as the resistance of the magnetoresistors changes. The power for the sensor probe 200 and all electrical components can be supplied by a battery source, but for this experiment, mains connected DC power supplies were used.

Driving signal: A 180 Hz square wave with 50% duty cycle produced by a function generator (although a 555 timer may also be used) was used to switch an h-bridge IC (L298N) supplied with a DC electromagnet coil current (IC). Due to the nature of the h-bridge, the direction of IC was switched to produce a 180 Hz magnetic field in the electromagnet 210 (90 turns, 20 mm long, 13 mm diameter, mild steel core, bobbin shape) with amplitude proportionate to ±IC.

Conditioning electronics: The conditioning electronics consisted of an instrumentation amplifier to receive the differential signal from the sensor bridge 100 and convert it to a single-ended output (referenced to GND), high-Q Deliyannis band pass filter, lock-in amplifier, fast response Sallen-Key low pass filter, and manual offset-amplifier. The final output signal was an offset DC signal, which was converted to a digital signal via a National Instruments DAQ6009, and the data recorded using an executable written in LabVIEW.

Lymph node samples: Three lymph node samples were used, all excised from the hind legs and groin region of a swine model approximately 2 hours after subcutaneous injection of a magnetic nanoparticle tracer (0.5 mL dose, 20 mg/mL). Before excision, the animal was imaged using an MRI to confirm the in vivo uptake of the magnetic nanoparticles into the lymphatic system. Two of the node samples, n1 and n2, were from the deep popliteal region and contained magnetic tracer as confirmed via T1 and T2* MR imaging post-excision. Node samples n1 and n2 were removed from the left and right hind legs, respectively. The third lymph node sample, n3 appeared to be a single superficial lymph node removed from the left hind leg and did not contain any magnetic nanoparticles—again as confirmed by post-excision T1 and T2* MR imaging. All nodes samples were stored in formalin fixative (40% formaldehyde) at 3° C. prior to the measurements.

Optimisation of the coil current: In the present embodiment of the sensor probe 200, the signal magnitude from magnetic nanoparticles sample was proportional to the current supplied to the electromagnet, and hence magnetising field. If the magnetising field is too low, then the sample of magnetic nanoparticles may not be completely magnetised, and the resultant signal will be small. If the magnetising field is too high, then the sensors will enter a non-linear region, and the sensitivity of the probe is compromised. Furthermore, the noise caused by thermal heating due to switching high coil currents through the h-bridge can also impede the sensitivity as the signal to noise ratio (SNR) is decreased.

Figure 15:
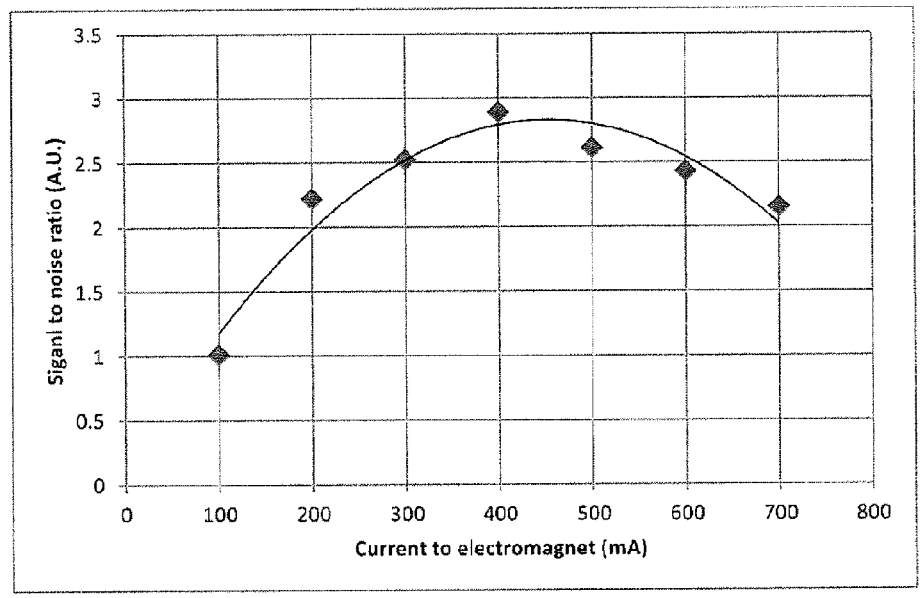
FIG. 15—shows a graph of signal to noise ratio vs current to the electromagnet in the sensor probe.

In order to determine the optimal coil current in the embodiment used for the experiment, a standard sample of 1 mg dried magnetic nanoparticles was placed a set distance from the probe tip and the signal recorded for a range of coil currents. The magnitude of this signal was then compared to the level of noise to find the SNR, as shown in FIG. 15. It was found that the graph of signal to noise ratio vs. electromagnet current followed a quadratic function, and hence it was determined that the ideal current for the coil was between 400 mA and 500 mA. As a result, for the following experiments, a coil current of 450 mA was used. Note that at low currents the SNR is low due to the weak magnetising field, whilst at higher currents the SNR begins to reduce due to significant thermal noise and the non-linear nature of the sensors in the presence of high magnetic field.

Measuring the nodes: In this experiment, the probe was held in place using a clamp and the nodes were brought up to its tip, but the results are expected to be the same if the nodes are fixed in place (e.g. still in the body) and the probe is brought up to the nodes.

Node samples n1 and n2 were measured by the sensor probe 200 at a distance approximately 0.1 mm to 1 mm from the tip of the probe. The samples were measured in multiple directions, and it was found that the signal strength changed depending on what part of the sample was measured. This can be explained by non-uniform uptake of tracer in the node samples, and the large dependence of signal strength on distance to the magnetic nanoparticles as demonstrated in FIG. 18 (see further below).

Figure 16:
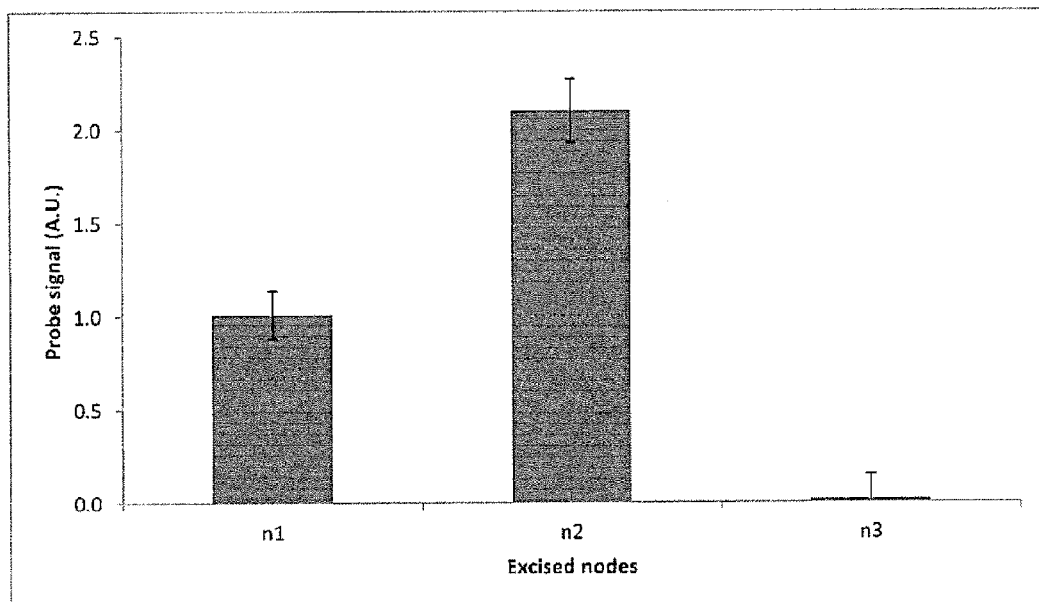
FIG. 16—shows the maximum change in signal measured by the sensor probe for each of the excised nodes in an experiment.

The change in probe signal was observed on a computer monitor, and indicated the presence and quantity of magnetic nanoparticles. FIG. 16 shows the maximum change in signal measured for each of the excised nodes. As a control, node sample n3 was also brought up to the tip of the probe (again within 0.1 mm to 1 mm), but no signal discernible from the background noise was recorded.

FIG. 16 specifically shows a comparison of the signal detected by the magnetometer probe for the deep popliteal node samples removed from the left and right hind legs of the pig. The positive and negative error bars are equal to three times the standard deviation of the background noise (3snoise). These results indicate a higher uptake in the right hind leg deep popliteal lymph nodes as the signal strength is proportional to the volume of magnetic nanoparticles present.

In further animal experiments which have been carried out, a total of 12 primary draining nodes (i.e. representative of the sentinel node in animals without cancer) were measured in vivo (during surgery) in a swine model.

In these experiments, five female swine ranging from of 35 to 50 kg in size were injected 4 cm above the hind hooves with 10 mg of magnetic nanoparticles in a 20 mg/mL dose. Each pig was imaged preoperatively before and after the injection of the magnetic particles to determine the anatomical location of the sentinel lymph nodes (identified to be deep popliteal lymph nodes in 4 animals and superficial inguinal in one animal).

Figure 17:
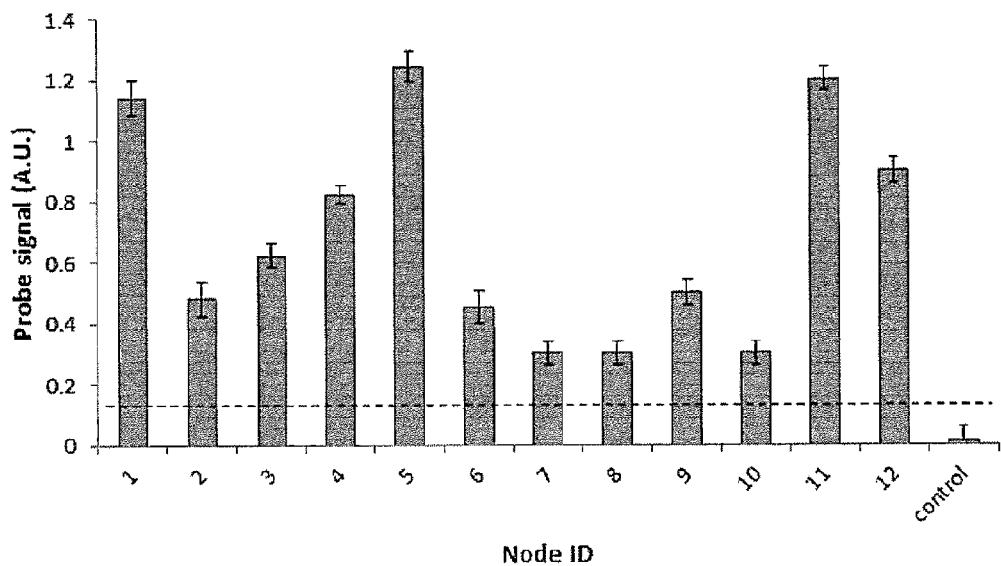
FIG. 17—shows a graph of probe signal for each of 12 excised nodes in another experiment.

Ninety minutes post injection, the pigs were sacrificed and the nodes exposed surgically. Once exposed, each sentinel node was measured at least twice (relative to background tissue signal) using the magnetometer probe embodiment described previously. Once confirmed to be a magnetic node (and therefore, represents the SLN), the organs were removed. A summary of the lymph nodes measured in this experiment is shown in FIG. 17. Note, the cut-off criteria for a 'positive' node was that the signal to noise ratio measured by the probe (equation 1) had to be greater than 2.0 (as shown by the dotted line on FIG. 17.)

$$SNR = \frac{\bar{x}}{3\sigma} \quad (1)$$

Where $\bar{x}$ is the magnitude of the mean signal from the node; and $\sigma$ is the standard deviation of the DC signal produced by the probe during measurement (i.e. measure of fluctuations in DC signal due to electronic noise).

In another method of measuring the longitudinal sensitivity—i.e. the change of signal with distance to source, use is made of a translational stage to measure continuously as the distance is changed instead of manually changing the distance and measuring discrete points as in the method described above.

Figure 18:
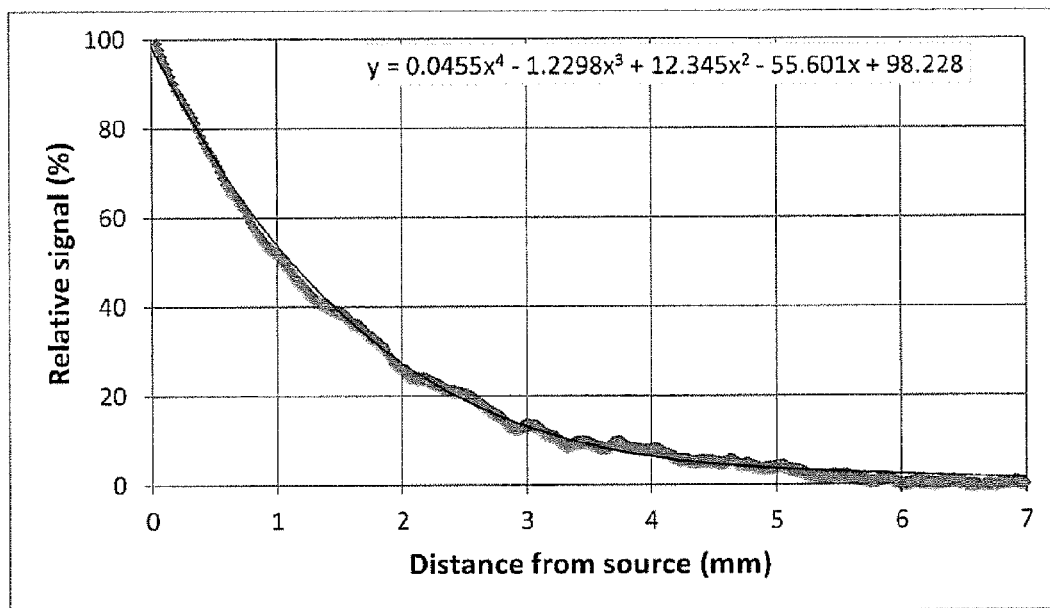
FIG. 18—shows the relationship between the output signal and the distance of the node from the probe tip.

To observe the effect that distance has on the measurements relating to FIG. 18, a 10 mg sample of magnetic nanoparticles (phantom) was measured as a function of distance using a motorised translational stage to change the sample-t-probe distance during measurement.

To control the distance, the phantom was placed on one end of a 30 cm plastic strip, with the other end of the strip attached to a 2" translational stage. The stage was moved by attaching a 100 rpm DC motor to the stage's micrometer adjustment knob. The translational position of the point source relative to the sensor probe 200 was measured before and after recording the response curve, and the distance scale determined. The results are shown in FIG. 18. Note the curve fitted to the data is true for 0.1 mm<x<7.0 mm, and is measured from an approximately spherical sample with diameter of 5.0 mm.

It will be appreciated that in the various aspects described herein, the sensors 100 are not in contact with, or close to, the particles being measured. In some embodiments, the distance between the sensor(s) 100 and the particles being measured is 10 to 100 times the dimensions of the individual magnetoresistor sensing elements 100. This includes between 10 times and 20 times, between 20 times and 30 times, between 30 times and 40 times, between 40 times and 50 times, between 10 times and 50 times, between 50 times and 60 times, between 60 times and 70 times, between 70 times and 80 times, between 80 times and 90 times, between 90 times and 100 times, between 50 times and 100 times. In other embodiments the distance between the sensor(s) 100 and the particles being measured is less than 10 times the dimensions of the individual magnetoresistor sensing elements 10, including between 1 times and 2 times, between 2 times and 3 three times, between 3 times and 4 times, between 4 times and 5 times, between 1 times and 5 times, between 6 times and 7 times, between 7 times and 8 times, between 8 times and 9 times, between 9 times and 10 times, and between 5 times and 10 times. In other embodiments, the distance between the sensor(s) 100 and the particles being measured is 100 to 200 times the dimensions of the individual magnetoresistor sensing elements 10, including between 100 times and 150 times and between 150 times and 200 times. In some embodiments, the distance between the sensor(s) 100 and the particles being measured is more than 200 times the dimensions of the individual magnetoresistor sensing elements 10, including up to 300 times, up to 400 times and up to 500 times.

Figure 19:
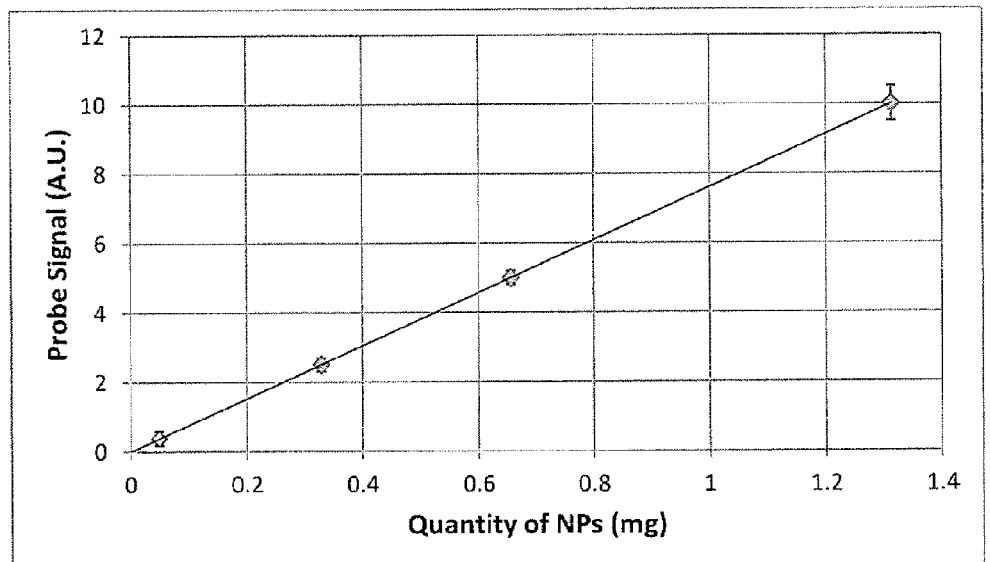
FIG. 19—shows a graph measuring the output signal for a range of magnetic nanoparticle quantities.

As a final measure of the characteristics of the sensor probe 200, the output signal with respect to a changing quantity of nanoparticles was measured. The set-up for this experiment consisted of the sensor probe 200 being fixed in place vertically with a clamp. Four samples of dried nanoparticles of varying quantities were measured at a fixed distance of 1 mm from the sensor probe 200, and the change in magnetometer signal measured, as shown in FIG. 19. As expected, the relationship between quantity and signal is a linear one, as shown by the line of best fit applied to the data.

In the above method, the sensitivity of the sensor probe 200 is measured using prototype electronics that introduced significant noise to the output signal, thereby reducing the quoted sensitivity of the sensor probe 200. To remove the influence of this noise, the output of the sensor probe 200 was measured for the MTJ sensor Wheatstone bridge 40 as described above with reference to FIGS. 4A and 4B (i.e. no switching magnetic field, no signal conditioning). This gives a more accurate measurement of the sensitivity achievable with the MTJ devices making up the sensor probe 200. In this method, three dried magnetic particle phantoms were measured at a fixed distance of 4.0 mm by clamping the sensor probe 200 vertically above a rotating stage holding the phantom samples. The stage was rotated at approximately 200 rpm and the signals from the passing phantoms measured on an oscilloscope. With these data, it was possible to extrapolate a sensitivity limit (where the signal:noise ratio is equal to 2.0) of 50 µg (0.05 mg) of magnetic particles. This result gives a more accurate measurement of the probe sensitivity as it reduces the negative impact that prototype electronics (e.g. assembled on stripboard) can have on the signal:noise ratio of a device. Note also that based on the data of FIG. 18, this sensitivity limit can be improved to just 5 µg (0.005 mg) if the sample is moved to within very close proximity (<1 mm) of the probe tip.

The spatial resolution of handheld probes such as gamma probes or magnetometer probes is a very important characteristic—particularly if the probe is to be used to distinguish sources of magnetic fields in close proximity (i.e. distinguish a magnetic sentinel lymph node from nearby, uninvolved nodes in complex lymphatic environments like gastrointestinal cancers).

In order to measure the spatial resolution, the sensor probe 200 is scanned laterally at a fixed distance from a point source (a source with dimensions equal to or smaller than the active sensing area of the probe) and the full width half maximum (FWHM) of the output response curve is measured to give a quantised spatial resolution.

Figure 20:
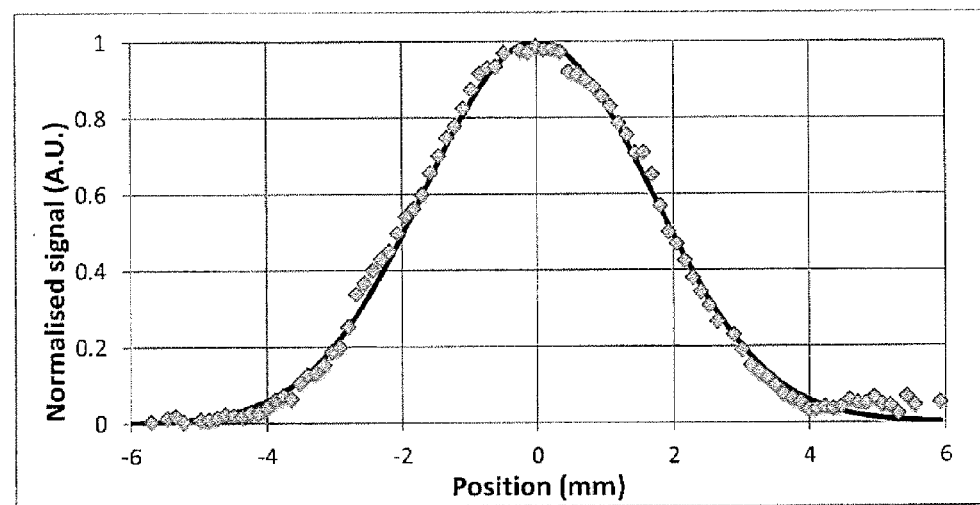
FIG. 20—shows a lateral sensitivity curve for the magnetoprobe.

The spatial resolution was measured using the same parameters as previously described. To measure the response curve, the sensor probe 200 was mounted vertically using a stand, and placed approximately 0.5 mm from the point source (10 mg of dried magnetic particles in a small 3 mm diameter, ~10 mm³ volume phantom). The automated stage as described above for the distance measurements was again used to control the displacement of the phantom relative to the sensor probe 200 tip. The position of the probe tip was at x=0, and the phantom scanned from x=−6.0 to +6.0 mm. The results of this process are shown in FIG. 20. From the FWHM, a spatial resolution of 4.0 mm was determined. This parameter is largely dependent on the size of the phantom and the size of the sensors 100, i.e. if the sensing area at the tip is reduced from approximately 4.0×2.0 mm down to 1.0×0.3 mm (i.e. if a single sensor 100 is used in place of 4 sensors 100), then this spatial resolution can be reduced even further—to approximately 1.0 mm.

As previously described with reference to FIGS. 1 to 4B, in various embodiments, the sensor probe 200 can comprise one or more magnetic sensors 100 with 1, 2, or 4 magnetoresistors 10 mounted in a bridge configuration which is located at the tip of the sensor probe 200. In the embodiment described previously, all four magnetoresistors 10 measure the signal from the electromagnet and the particles, hence the overall signal is an averaged signal from the 4 magnetoresistors 10. It will be appreciated by those skilled in the art that for certain arrangements of magnetoresistors 10 in a bridge configuration, an embodiment consisting of 4 magnetoresistors 10 can produce a signal twice as large as an embodiment consisting of 2 magnetoresistors 10. Similarly, an embodiment consisting of 2 magnetoresistors 10 can produce a signal twice as large as an embodiment consisting of 1 magnetoresistors 10.

Figure 21:
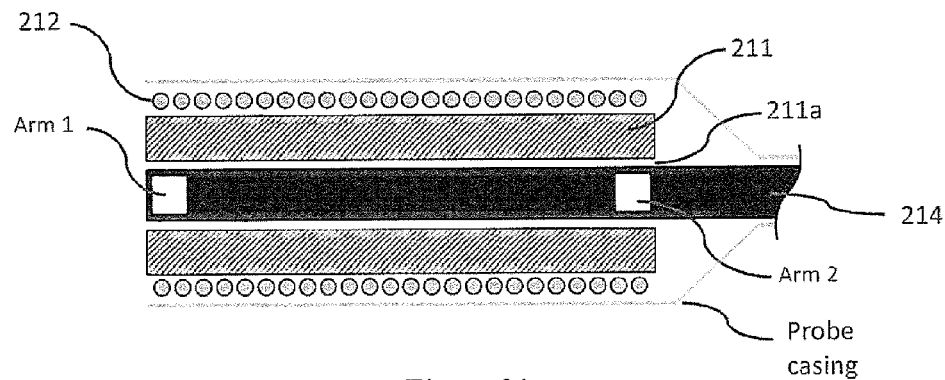
FIG. 21—is a schematic diagram of another embodiment of the probe.
Figure 22A:
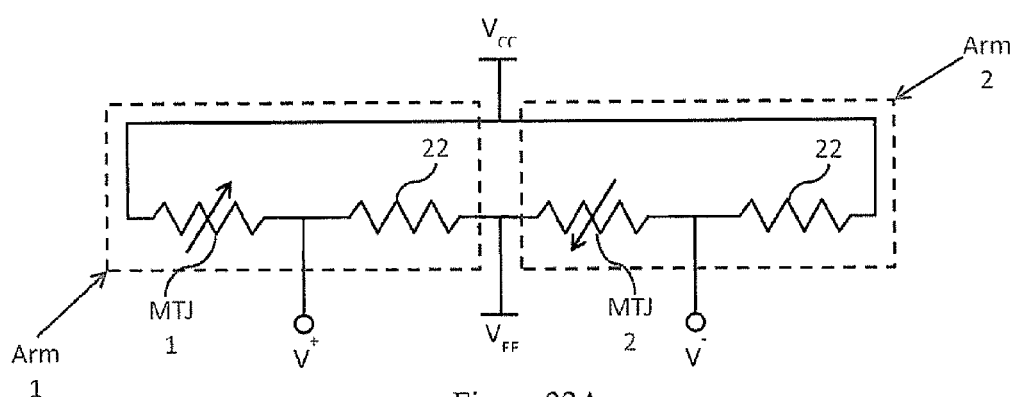
FIG. 22A—is a schematic diagram of another embodiment of a 2-sensor offset design.
Figure 22B:
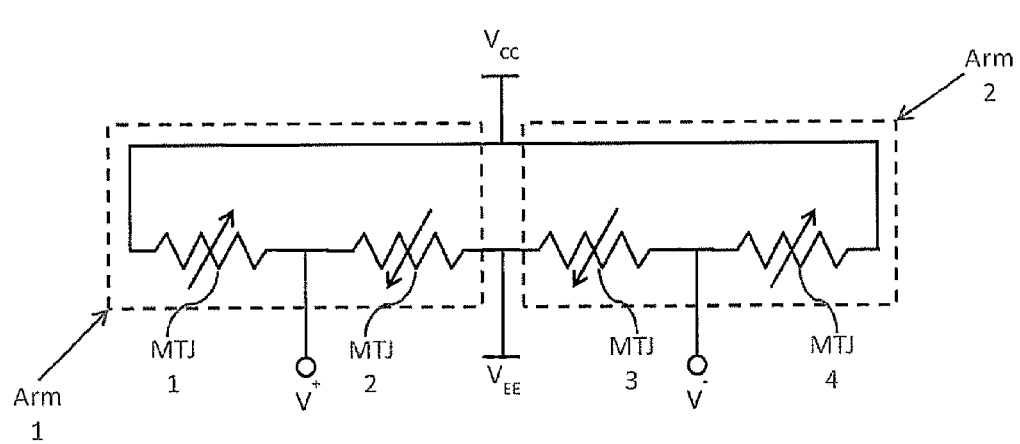
FIG. 22B—is a schematic diagram of another embodiment with a 4-sensor offset design.
Figure 23A:
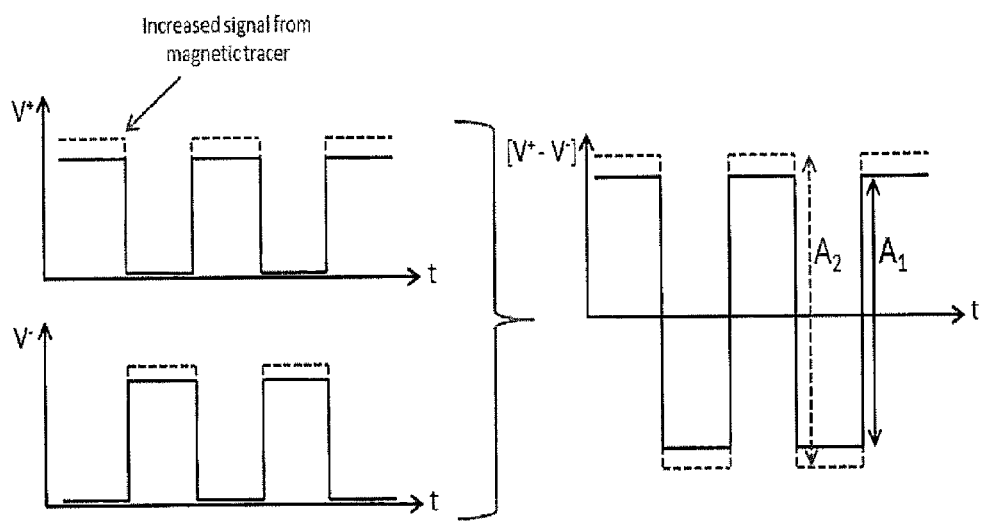
FIG. 23A—is a diagram showing the principle of operation of the embodiment of the probe with sensor arrangement as described with reference to FIGS. 2 and 3.
Figure 23B:
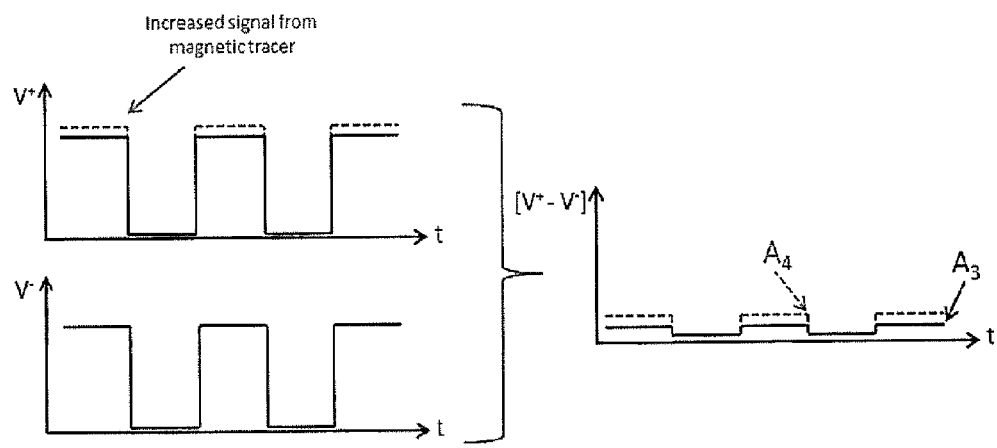
FIG. 23B—is a diagram showing the principle of operation of the probe with the offset sensor arrangement of FIG. 22B.

In one embodiment of the sensor probe 200 comprising a magnetic sensor 100 utilising 2 or 4 magnetoresistors 10, one arm of the bridge of the magnetic sensor 100 is mounted at the tip of the sensor probe 200, and the other arm of the bridge is mounted away from the tip at the opposing end of the electromagnet 210. An example of this arrangement is shown in FIG. 21. As opposed to aligning the magnetoresistors 10 so that both arms of the bridge constructively increase the bridge voltage ($V_B$) (as shown in the embodiment described with reference to FIG. 2 and FIG. 3) they are aligned such that changes in $V_B$ due to one arm are opposed by the other arm (see FIGS. 22A and 22B). By doing this, the signal from the electromagnet measured by the sensors at the tip of the probe will be cancelled out by the signal measured by the sensors at the back-end of the probe 200. Since the magnetoresistors 10 mounted at the back-end of the probe will be too far away from the tip of the probe 200 to measure a signal from the magnetic tracer (e.g. in the sentinel lymph node) or other magnetic materials at the probe tip, this signal will not be cancelled out. Although the magnitude of the signal from the magnetoresistors 10 at the tip of the probe 200 will be reduced (as previously described), the signal to noise ratio may also be reduced by attenuating the large signal from the electromagnet 210. This principle is illustrated in FIGS. 23A and 23B. With reference to FIG. 23A, the 'magnetic particles to electromagnet signal ratio' ($S_1$) is:

$$S_1 = \frac{(A_2 - A_1)}{A_1} \qquad (2)$$

Where $A_1$ is the amplitude of the bridge signal from the electromagnet with no tracer present; and $A_2$ is the amplitude of the bridge signal from both the electromagnet and magnetic particles present near the tip of the probe 200. On the other hand, the magnetic particles to electromagnet signal ratio ($S_2$) for the offset embodiment (see FIG. 23B) is:

$$S_2 = \frac{(A_4 - A_3)}{A_3} \qquad (3)$$

where, for the offset embodiment, $A_3$ is the amplitude of the bridge signal from the electromagnet with no tracer present; and $A_4$ is the amplitude of the bridge signal from both the electromagnet and magnetic particles present near the tip of the probe 200. While the magnetic particles signal for the embodiment described previously, ($A_2$-$A_1$) will be larger than the magnetic particles signal for the proposed offset embodiment ($A_4$-$A_3$), since $A_1$>>$A_3$ then overall, $S_2$>$S_1$. Note that in FIG. 23B, $A_3 \neq 0$—i.e. it is unlikely that electromagnet signals measured by the two arms of the bridge will exactly cancel each other out (due to small differences in each sensor during manufacture, alignment and positioning of the sensors 100).

Figure 24:
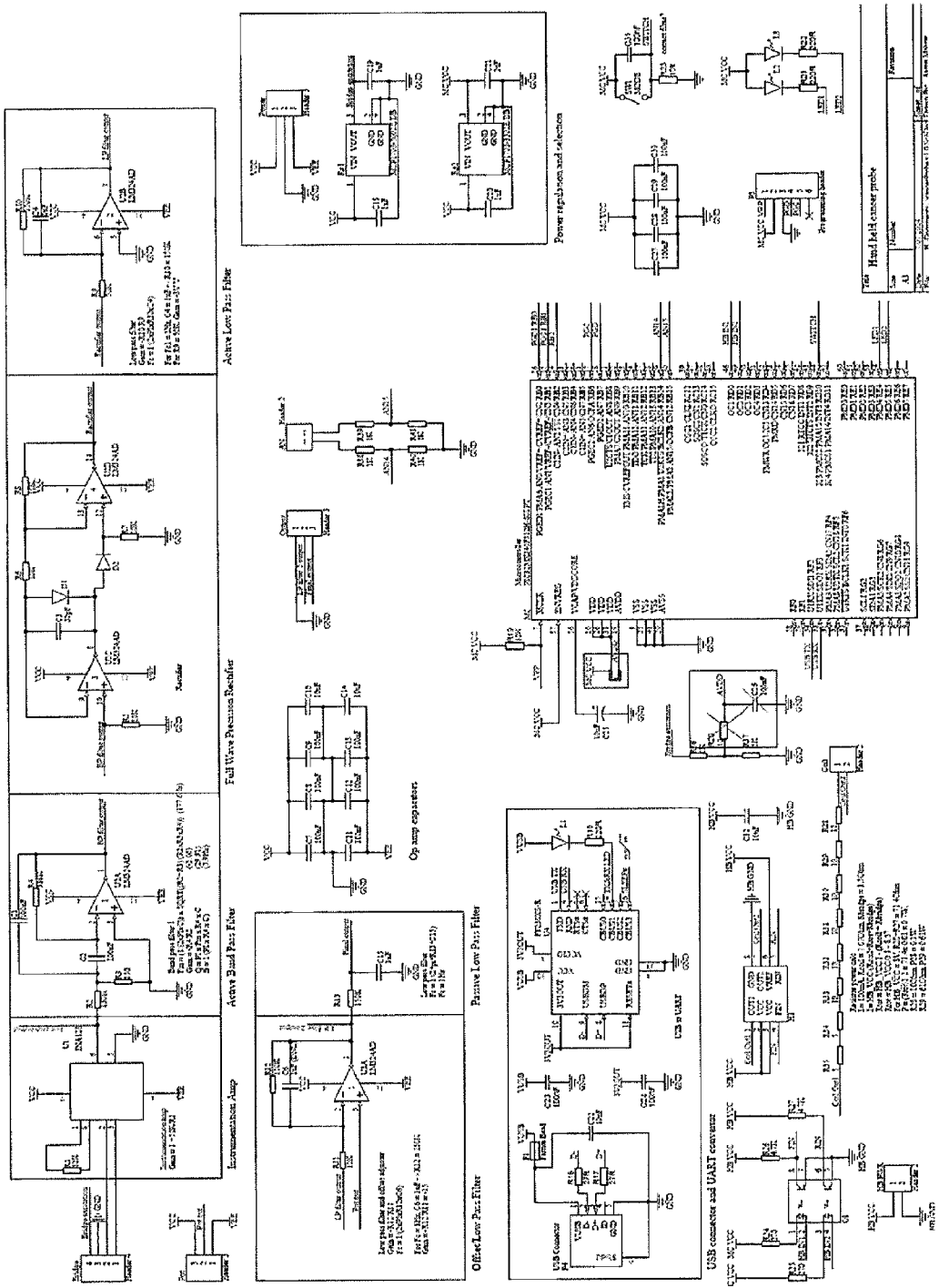
FIG. 24—is a circuit schematic of another embodiment of the probe system.

FIG. 24 shows a schematic of another embodiment of the probe. This embodiment exhibits a number of differences from the circuit of the embodiment of FIG. 12A. In this embodiment, the number of amplifier stages has been reduced, thus reducing the cost, size and electrical noise. In order of input to output as shown in the circuit of FIG. 24, the amplifier stages include an instrumentation amplifier with a gain of 5V/V, an active band pass filter (−2.08V/V gain and about 180 Hz centre frequency), an active filter, an active low pass filter (−3V/V gain and 1 Hz corner frequency), an offset adjustment amplifier (−15V/V gain), and a passive low pass filter (1 Hz corner frequency).

The circuit also has a different coil driving circuit encompassing an H-Bridge and complete electrical isolation from the rest of the circuit by using an opto-isolator.

A microcontroller is also provided in the circuit to allow for convenient frequency setting of the coil, and allows for the capability of including analogue to digital conversion and data transfer to a PC via a USB for example.

Figure 25:
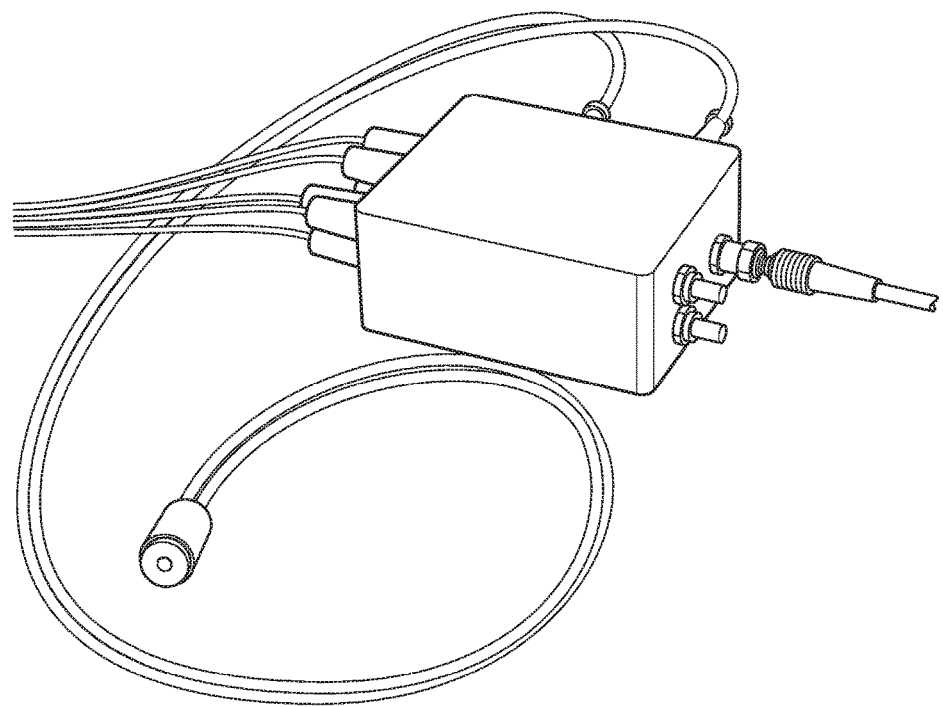
FIG. 25—shows an embodiment of the system enclosed in a metal casing with the probe connected thereto.

To promote electromagnetic shielding, the circuit is housed in a metal enclosure as shown in FIG. 25. The two isolated power supply inputs are accessible via banana sockets and the coil and sensor have corresponding RCA and DIN5 connectors on a side of the enclosure. The output DC offset can be controlled by coarse and fine adjustments. The output is provided via a BNC connector.

Once powered, the microcontroller automatically starts powering the coil at a set frequency (185 Hz). This frequency can be changed by adjusting a value in the firmware and reprogramming the microcontroller. Reprogramming may be done using suitable tools such as MPLAB, the XC32 compiler and a pic programmer (ICD or PICKit). The PCB includes a 6-pin programming header compatible with these programmers.

In other embodiments, a communications block can be provided to transmit data wirelessly. Any suitable protocol and associated circuitry and software can be used, including for use with Bluetooth™, ZigBee™ or other protocols as will be understood by the person skilled in the art.

Such an embodiment could be provided in a probe as previously described with reference to FIG. 14D in which the entire system is provided within the probe casing and can transmit the measured data to remote receiver for further processing or use by another processor or medical practitioner or technician.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

The reference to any prior art in this specification is not, and should not be taken as an acknowledgement of any form of suggestion that such prior art forms part of the common general knowledge.

It will be appreciated by those skilled in the art that the various embodiments described are not restricted in use to the particular applications described. Neither are the various embodiments restricted with regard to the particular elements and/or features described or depicted herein. It will be appreciated that the various aspects are not limited to the embodiment or embodiments disclosed, but are capable of numerous rearrangements, modifications and substitutions without departing from the scope as set forth and defined by the following claims.

What is claimed is:

1. A sensor probe for detecting a magnetic particle, the sensor probe comprising:
    at least one magnetic sensor for measuring flux density and for sensing a fluctuation in a surrounding magnetic field, the magnetic sensor comprising at least one tunnelling magnetoresistor, supporting circuitry, and at least one output for outputting an output signal proportional to the resistance of the at least one tunnelling magnetoresistor;
    an electromagnet supporting the at least one magnetic sensor, wherein the electromagnet comprises a magnetic core with a conductive coil wrapped around the core and wherein the magnetic core has a core aperture extending through the magnetic core, with a shaft received within the core aperture and spaced from a defining wall of the core aperture, wherein the magnetic sensor is supported by the shaft; and
    a signal generator input for receiving an input signal from a signal generator for generating a current in the electromagnet thereby generating a sensor probe magnetic field which forms at least a part of the surrounding magnetic field.

2. The sensor probe as claimed in claim 1, wherein the magnetic sensor comprises two tunnelling magnetoresistors.

3. The sensor probe as claimed in claim 2, wherein the magnetic sensor comprises three tunnelling magnetoresistors.

4. The sensor probe as claimed in claim 3, wherein the magnetic sensor comprises four tunnelling magnetoresistors.

5. The sensor probe as claimed in claim 2, wherein the magnetic sensor comprises a Wheatstone bridge.

6. The sensor probe as claimed in claim 5, wherein the Wheatstone bridge comprises four tunnelling magnetoresistors forming a first leg and a second leg with two of the tunnelling magnetoresistors in each leg.

7. The sensor probe as claimed in claim 6, wherein a first end of a first tunnelling magnetoresistor is connected to a supply voltage and a second end of the first tunnelling magnetoresistor is connected to a first junction point; a first end of a second tunnelling magnetoresistor is connected to the first junction point and a second end of the second tunnelling magnetoresistor is connected to an electrical ground connection, the first and second tunnelling magnetoresistors forming the first leg; a first end of a third tunnelling magnetoresistive sensor is connected to the supply voltage and a second end of the third tunnelling magnetoresistor is connected to a second junction point; a first end of a fourth tunnelling magnetoresistor is connected to the second junction point and the second end of the fourth tunnelling magnetoresistor is connected to the electrical ground connection, the third and fourth tunnelling magnetoresistors forming the second leg.

8. The sensor probe as claimed in claim 7, wherein the output is provided by a potential difference between the first junction point and the second junction point.

9. The sensor probe as claimed in claim 2, wherein the two tunnelling magnetoresistors are spin tunnelling magnetoresistors.

10. The sensor probe as claimed in claim 2, wherein the two tunnelling magnetoresistors are magnetic tunnelling magnetoresistors.

11. A sensor probe as claimed in claim 1, wherein the magnetic core is cylindrical.

12. A sensor as claimed in claim 1, wherein the magnetic core is bobbin-shaped.

13. A magnetic probe system comprising:
    the sensor probe as claimed in claim 1;
    the signal generator for generating the input signal for input to the signal generator input of the sensor probe; and
    a signal processor for receiving the output signal and for providing an indication of the presence of the magnetic particle.

14. A magnetic probe system as claimed in claim 13 wherein the signal generator and the signal processor are provided in a single unit comprising a signal generator output outputting the input signal and an input for receiving the output signal from the magnetic sensor.

15. A magnetic probe system as claimed in claim 13 wherein the signal processor is contained within the sensor probe.

16. A magnetic probe system as claimed in claim 13 wherein the signal generator is contained within the sensor probe.

17. A magnetic probe system as claimed in claim 13 wherein the signal generator and the signal processor are contained within the sensor probe.

18. A processor for processing a signal received from the output of the magnetic probe system as claimed in claim 13, the processor configured to:
    receive the output signal from the output of the magnetic sensor;
    filtering out low frequency components from the signal to provide a filtered signal;
    offset the filtered signal to provide an offset signal;
    rectify the offset signal to provide a rectified offset signal; and
    compare the rectified offset signal to a threshold.

19. A magnetic probe system as claimed in claim 13, wherein the system is configured to measure one or more magnetic particles having a combined magnetic field of at least 50 µG.

20. A magnetic probe system as claimed in claim 13, wherein the system is configured to measure one or more magnetic particle having a combined magnetic field of at least 5 µG.

21. A magnetic probe system as claimed in claim 13, wherein the system is configured to have a spatial resolution of at least 4 mm.

22. A magnetic probe system as claimed in claim 13, wherein the system is configured to have a spatial resolution of at least 1 mm.

23. A magnetic probe system as claimed in claim 13, the magnetic probe system being configured to:
   generate the input signal to cause the electromagnet to induce a magnetic field;
   processing the output signal received from the output of the magnetic sensor; and
   indicate the presence of a magnetic particle if the rectified offset signal meets or exceeds the threshold.

24. A sensor probe as claimed in claim 1, wherein the diameter of the magnetic core is less than or equal to 10 mm.

25. A sensor probe as claimed in claim 24, wherein the diameter of the magnetic core is 9 mm.

26. A sensor probe as claimed in claim 1, wherein the diameter of the core aperture of the magnetic core is 4 mm.

27. A sensor probe as claimed in claim 1, wherein the magnetic sensor is located within the core aperture of the magnetic core.

28. A sensor probe as claimed in claim 27, wherein the magnetic sensor is located at a tip of the shaft.

29. A sensor probe as claimed in claim 27, wherein the magnetic sensor is located along the shaft further inside the core aperture.

30. A sensor probe as claimed in claim 27, wherein the magnetic sensor is moveable to different locations along the shaft.

31. A sensor probe as claimed in claim 27, wherein the magnetic sensor comprises a plurality of individual magnetic sensors located at different distances along the shaft and which may be selectively switched into operation.

32. A sensor probe as claimed in claim 1, wherein the shaft comprises a printed circuit board.

* * * * *